US006964918B1

(12) United States Patent
Fan et al.

(10) Patent No.: US 6,964,918 B1
(45) Date of Patent: Nov. 15, 2005

(54) ELECTRONIC COMPONENTS SUCH AS THIN ARRAY PLASTIC PACKAGES AND PROCESS FOR FABRICATING SAME

(75) Inventors: Chun Ho Fan, Sham Tseng (HK); Kwok Cheung Tsang, Fanling (HK)

(73) Assignee: Asat Ltd., New Territories (HK)

( * ) Notice: Subject to any disclaimer, the term of this patent is extended or adjusted under 35 U.S.C. 154(b) by 0 days.

(21) Appl. No.: 10/757,499

(22) Filed: Jan. 15, 2004

Related U.S. Application Data

(63) Continuation-in-part of application No. 09/802,678, filed on Mar. 9, 2001, which is a continuation-in-part of application No. 09/288,352, filed on Apr. 8, 1999, now Pat. No. 6,498,099, which is a continuation-in-part of application No. 09/095,803, filed on Jun. 10, 1998, now Pat. No. 6,229,200.

(51) Int. Cl.$^7$ .............................................. H01L 21/44
(52) U.S. Cl. ...................................... 438/614; 257/729
(58) Field of Search ........................ 438/111–119, 123, 438/124, 411, 461, 611–614, 703, 717; 257/687, 257/729, 708–711

(56) References Cited

U.S. PATENT DOCUMENTS

| | | | |
|---|---|---|---|
| 4,530,152 A | 7/1985 | Roche et al. ................. | 29/588 |
| 4,685,998 A | 8/1987 | Quinn, Daniel J. et al. | 156/633 |
| 5,066,831 A | 11/1991 | Spielberger et al. ........ | 361/412 |
| 5,293,072 A | 3/1994 | Tsuji et al. .................. | 257/737 |
| 5,444,301 A | 8/1995 | Song et al. .................. | 257/737 |
| 5,457,340 A | 10/1995 | Templeton, Jr. et al. .... | 257/666 |
| 5,710,695 A | 1/1998 | Manteghi .................... | 361/813 |
| 5,726,502 A * | 3/1998 | Beddingfield ............... | 257/797 |
| 5,777,382 A | 7/1998 | Abbott et al. ............... | 257/695 |
| 5,900,676 A * | 5/1999 | Kweon et al. .............. | 257/787 |
| 5,976,912 A | 11/1999 | Fukutomi et al. .......... | 438/110 |
| 6,001,671 A | 12/1999 | Fjelstad ...................... | 438/112 |
| 6,057,601 A | 5/2000 | Lau et al. ................... | 257/730 |
| 6,081,029 A | 6/2000 | Yamaguchi | |
| 6,093,584 A | 7/2000 | Fjelstad | |
| 6,153,503 A * | 11/2000 | Lin et al. .................... | 438/613 |
| 6,194,786 B1 | 2/2001 | Orcutt ........................ | 257/780 |
| 6,229,200 B1 | 5/2001 | Mclellan et al. ........... | 257/666 |
| 6,238,952 B1 | 5/2001 | Lin | |
| 6,294,830 B1 | 9/2001 | Fjelstad ...................... | 257/724 |
| 6,306,685 B1 | 10/2001 | Liu et al. .................... | 438/121 |

(Continued)

FOREIGN PATENT DOCUMENTS

JP 59-208756 11/1984

Primary Examiner—David Nelms
Assistant Examiner—Calvin Lee
(74) Attorney, Agent, or Firm—Keating & Bennett, LLP

(57) ABSTRACT

A process for fabricating an integrated circuit package includes establishing a plating mask on a first surface of a metal carrier. The plating mask defines a plurality of components including a die attach pad, at least one row of contact pads and at least one additional electronic component. A plurality of metallic layers are deposited on exposed portions of the first surface of the metal carrier. The plating mask is stripped from the metal carrier, leaving the plurality of metallic layers in the form of the plurality of components. A semiconductor die is mounted to die attach pad and pads of the semiconductor die are electrically connected to ones of the contact pads and to the additional electronic component. The first surface of the metal carrier is overmolded to encapsulate the plurality of components and the semiconductor die and the metal carrier is etched away.

15 Claims, 43 Drawing Sheets

U.S. PATENT DOCUMENTS

| | | |
|---|---|---|
| 6,459,163 B1 | 10/2002 | Bai .............................. 257/787 |
| 6,498,099 B1 | 12/2002 | McLellan et al. ........... 438/689 |
| 6,528,877 B2 | 3/2003 | Ernst et al. .................. 257/707 |
| 6,585,905 B1 | 7/2003 | Fan et al. ..................... 216/14 |
| 6,586,677 B2 | 7/2003 | Glenn |
| 6,635,957 B2 | 10/2003 | Kwan et al. ................. 257/691 |
| 6,821,821 B2 | 11/2004 | Fjelstad |
| 2003/0015780 A1 | 1/2003 | Kang et al. ................. 257/684 |

* cited by examiner

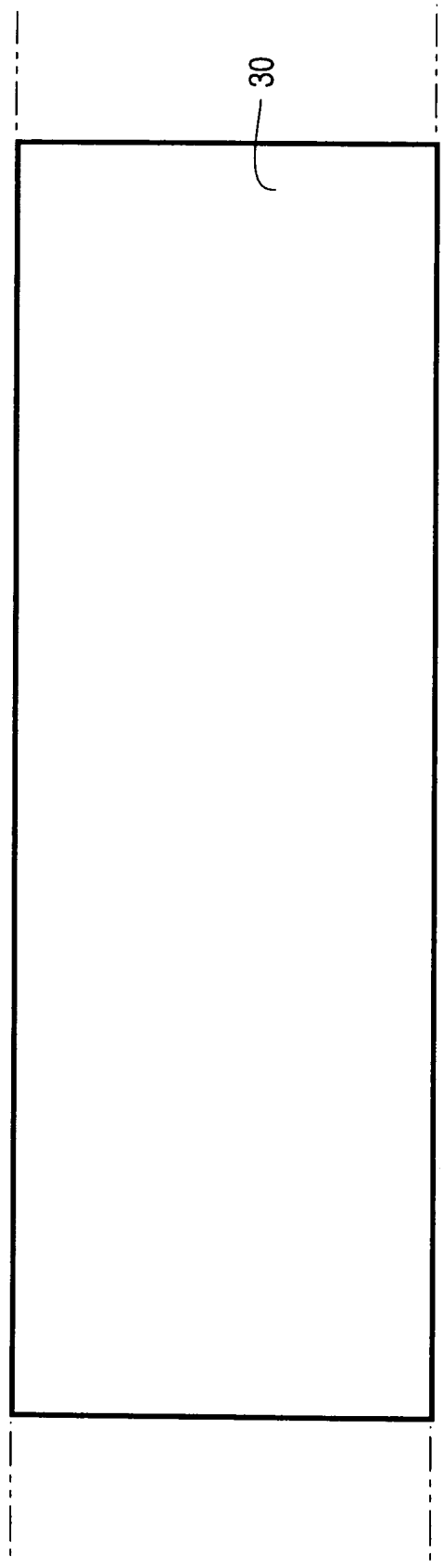
Figure 1A (1)
Figure 1A (2)

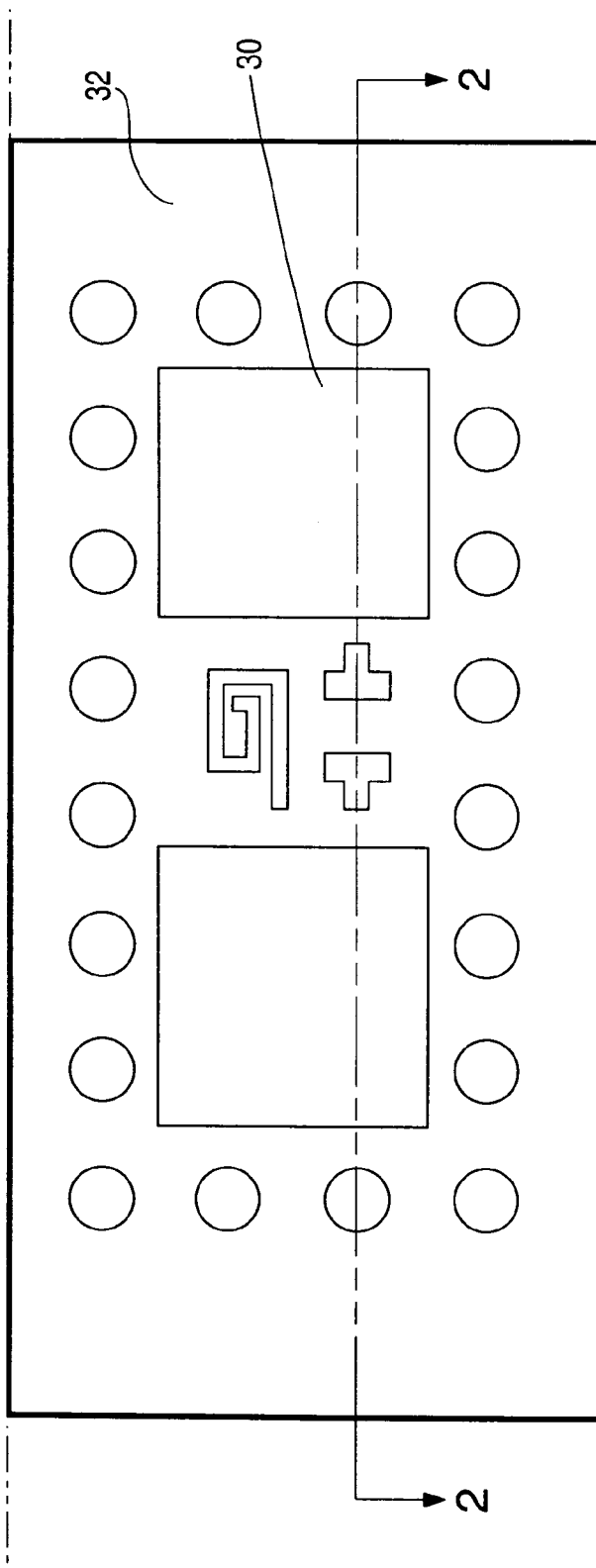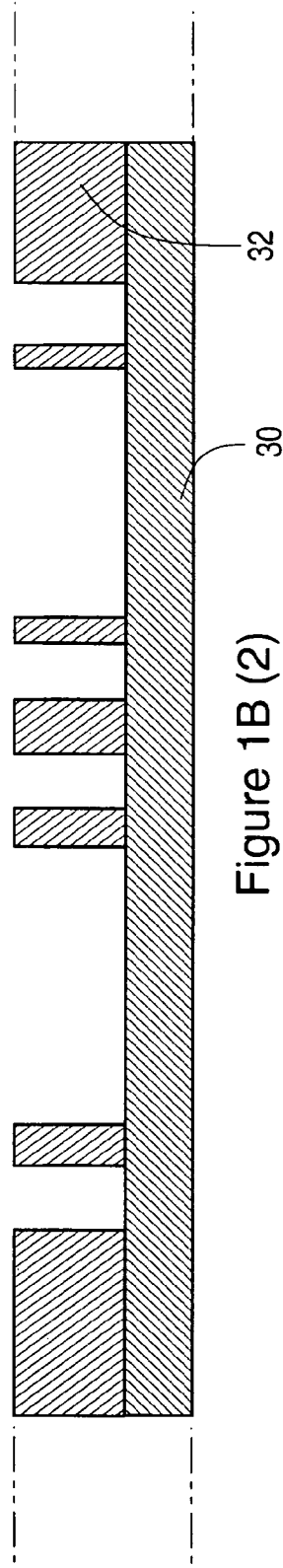
Figure 1B (1)
Figure 1B (2)

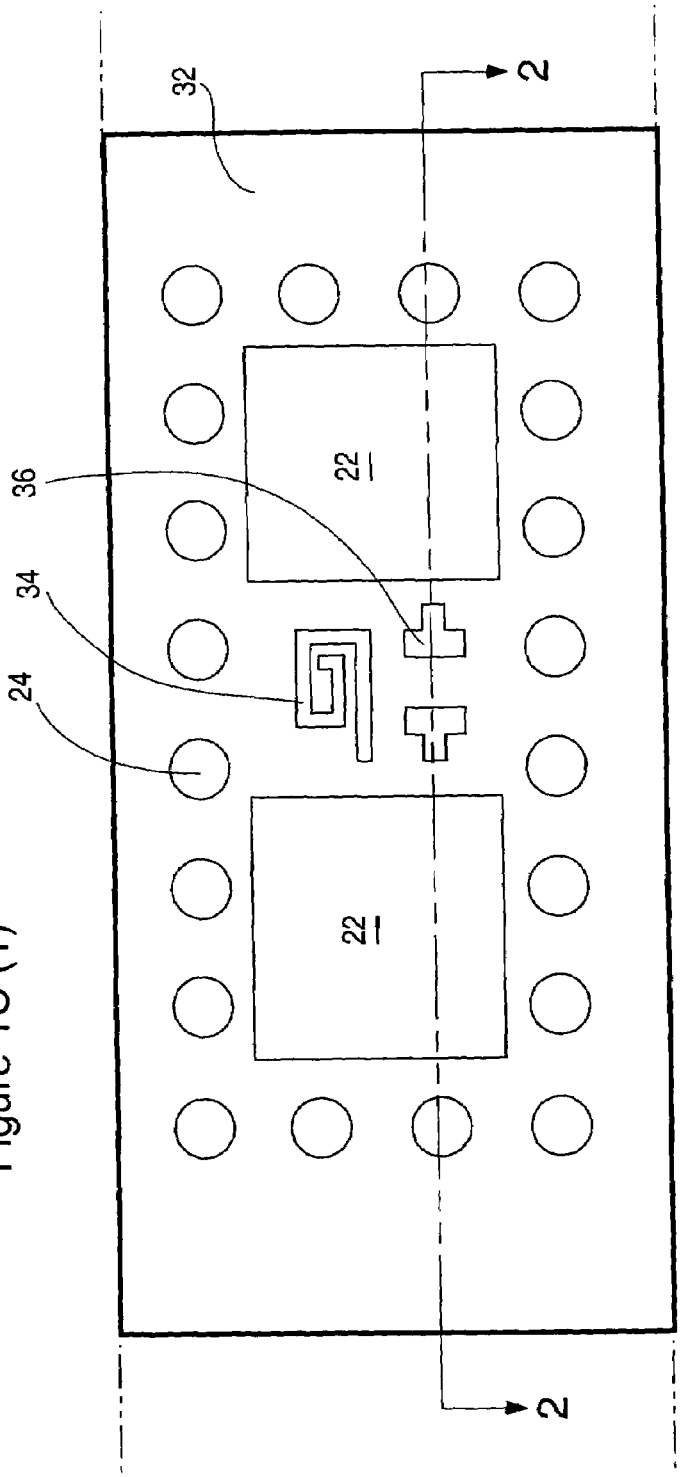
Figure 1C (1)
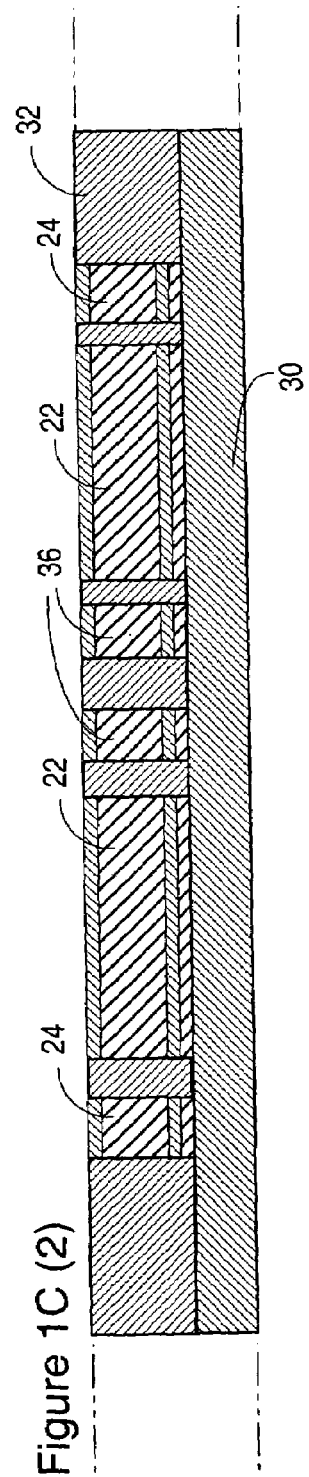
Figure 1C (2)

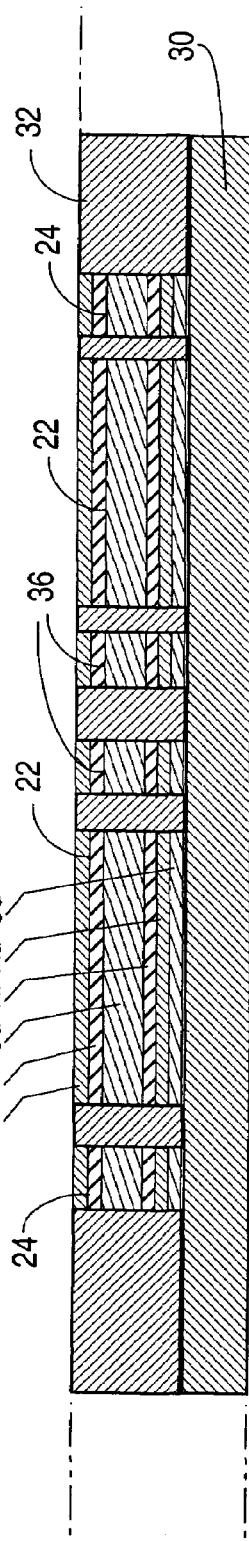
Figure 1C (3)
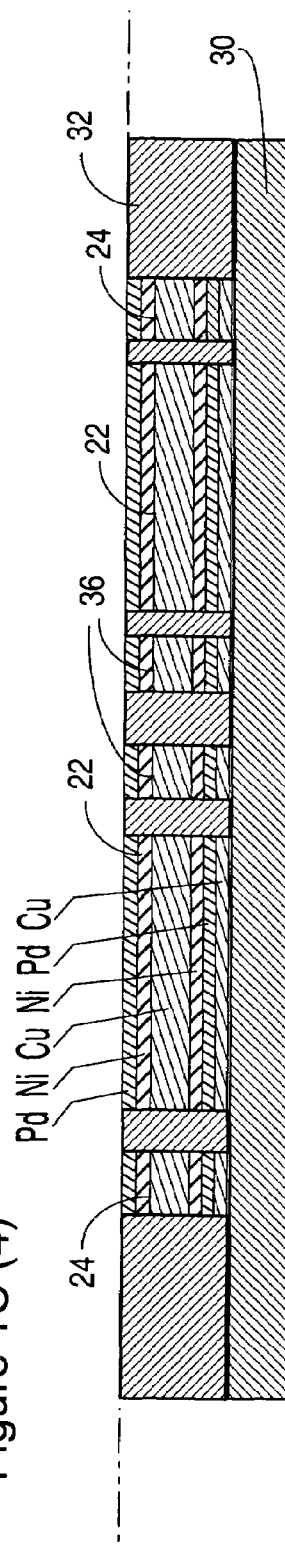
Figure 1C (4)
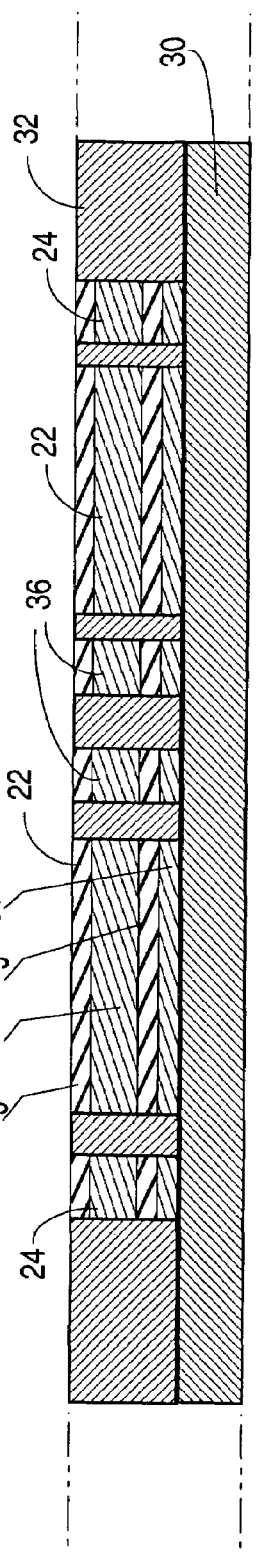
Figure 1C (5)

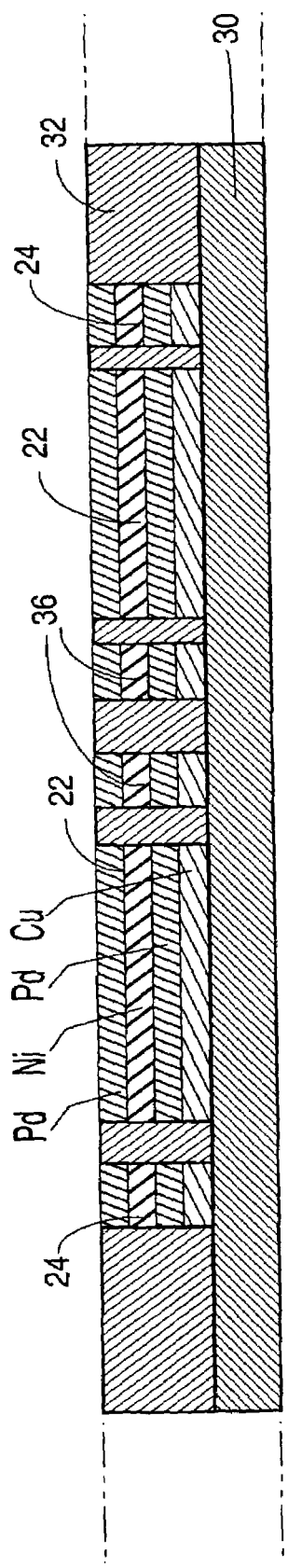
Figure 1C (6)
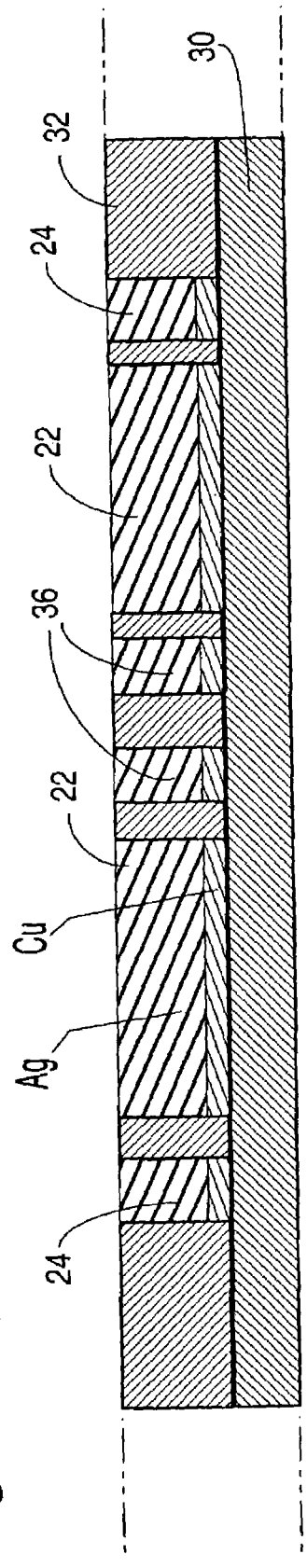
Figure 1C (7)

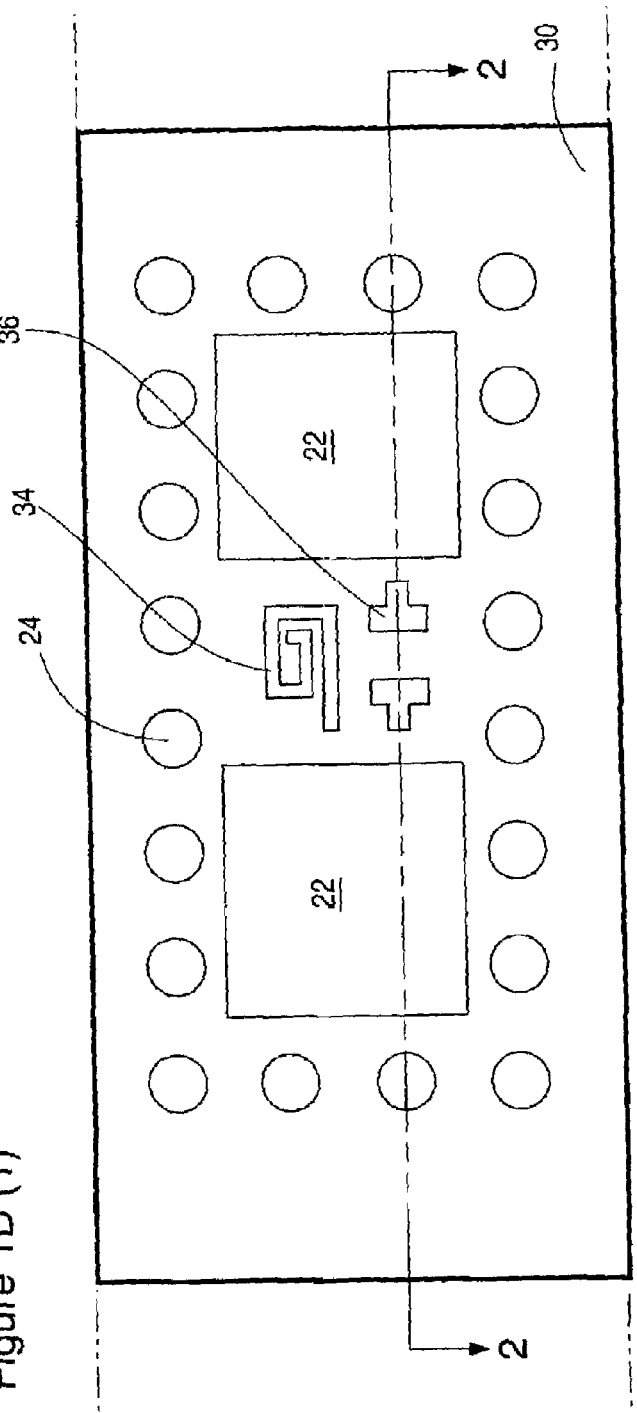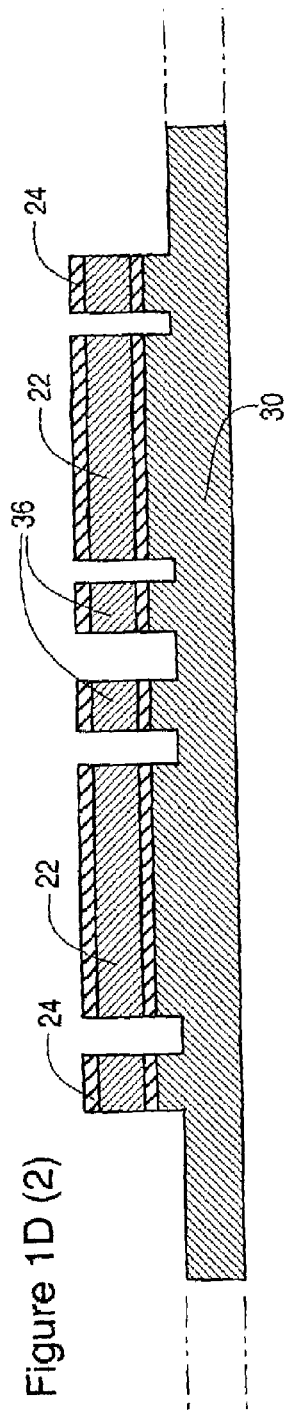

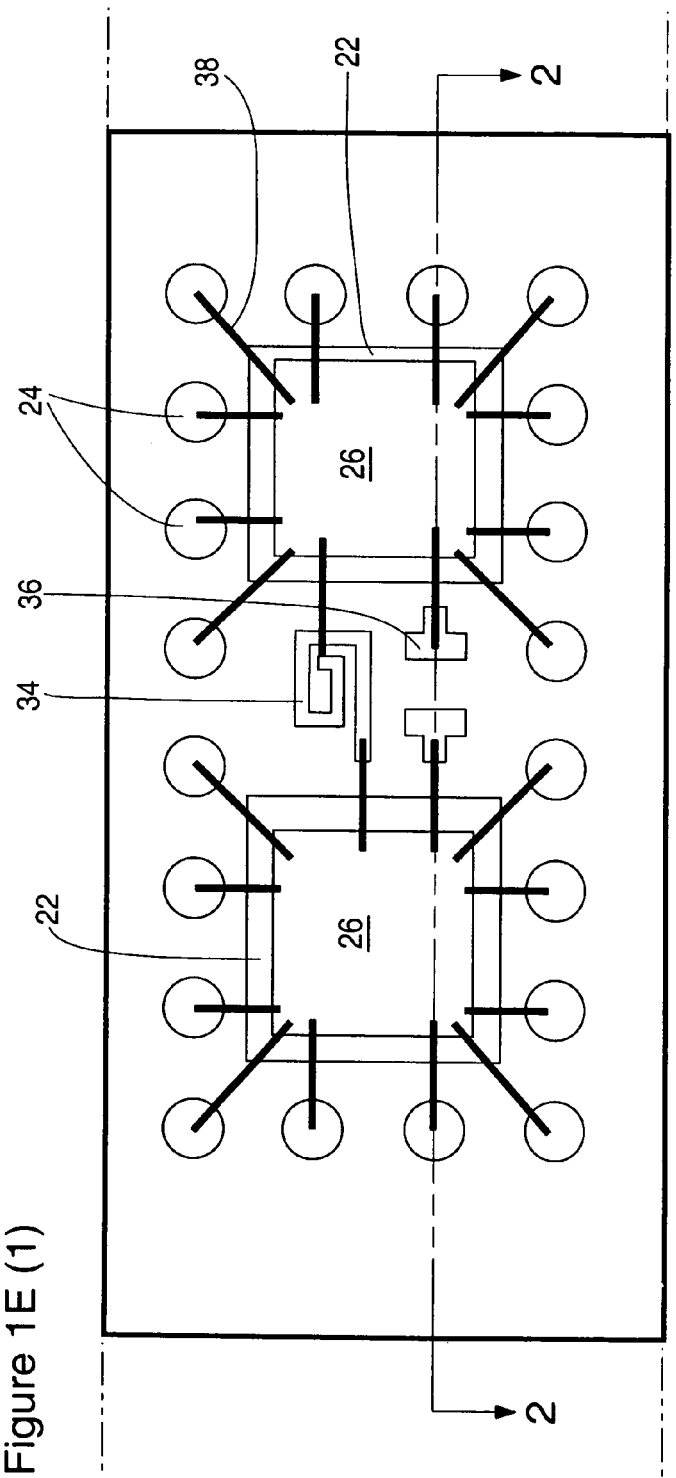
Figure 1E (1)
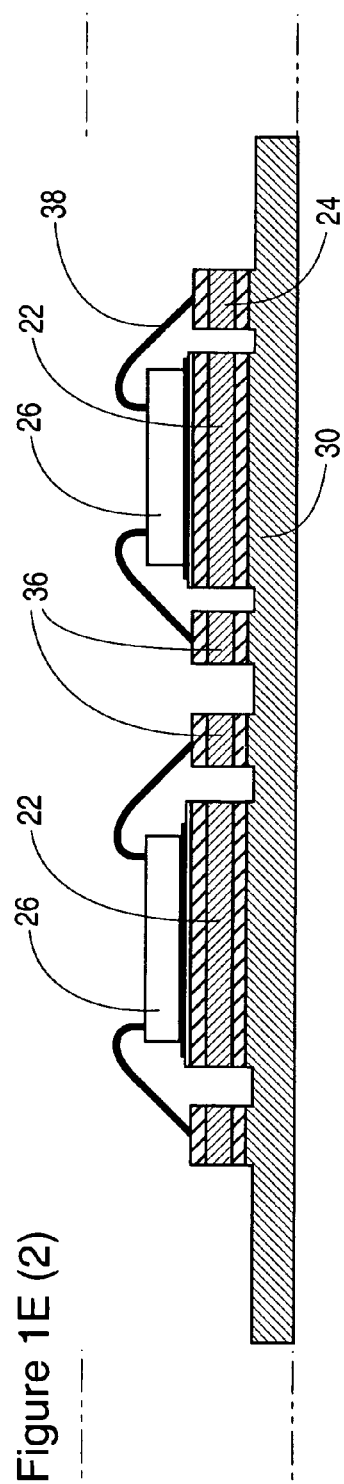
Figure 1E (2)

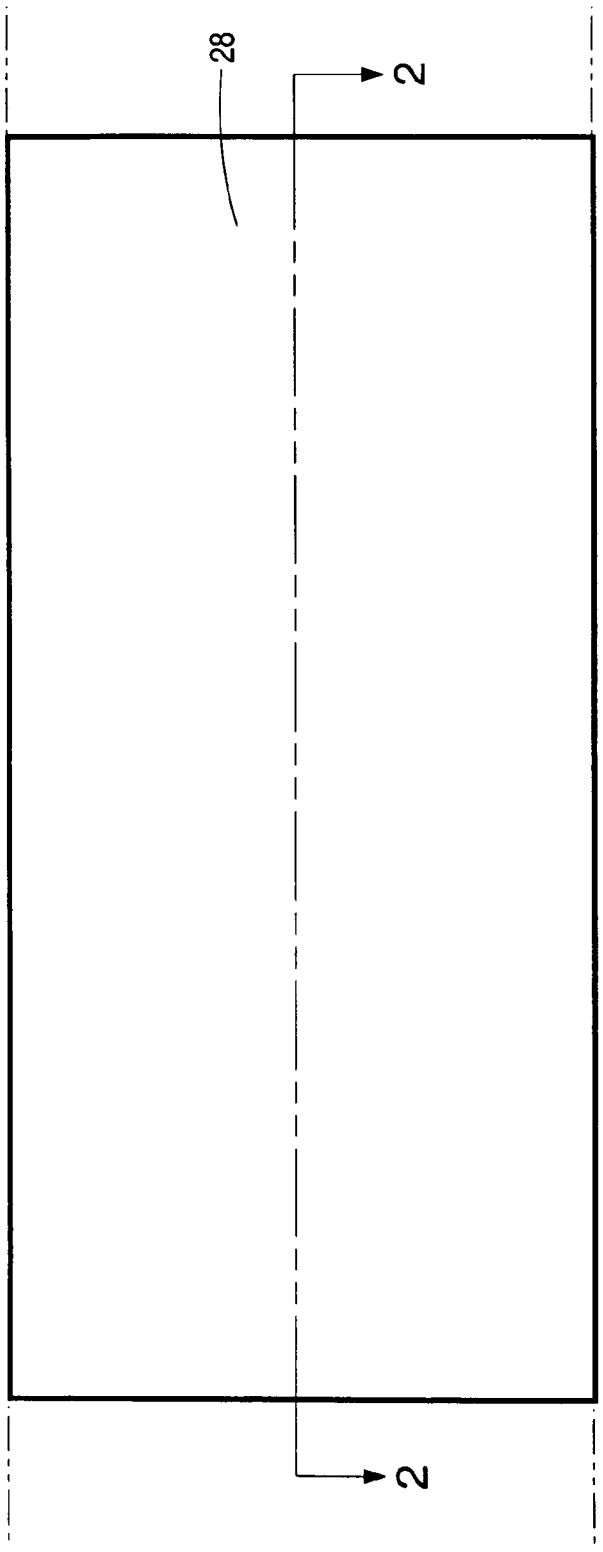
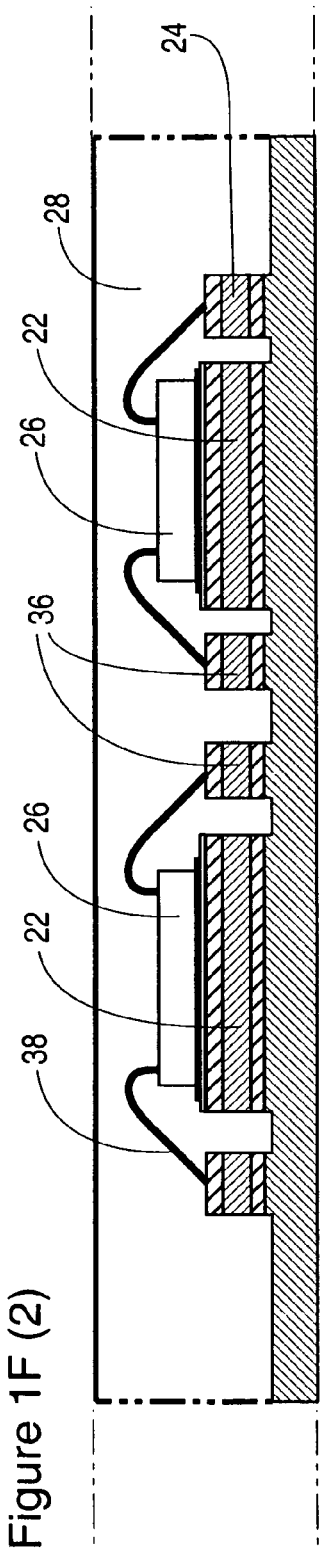

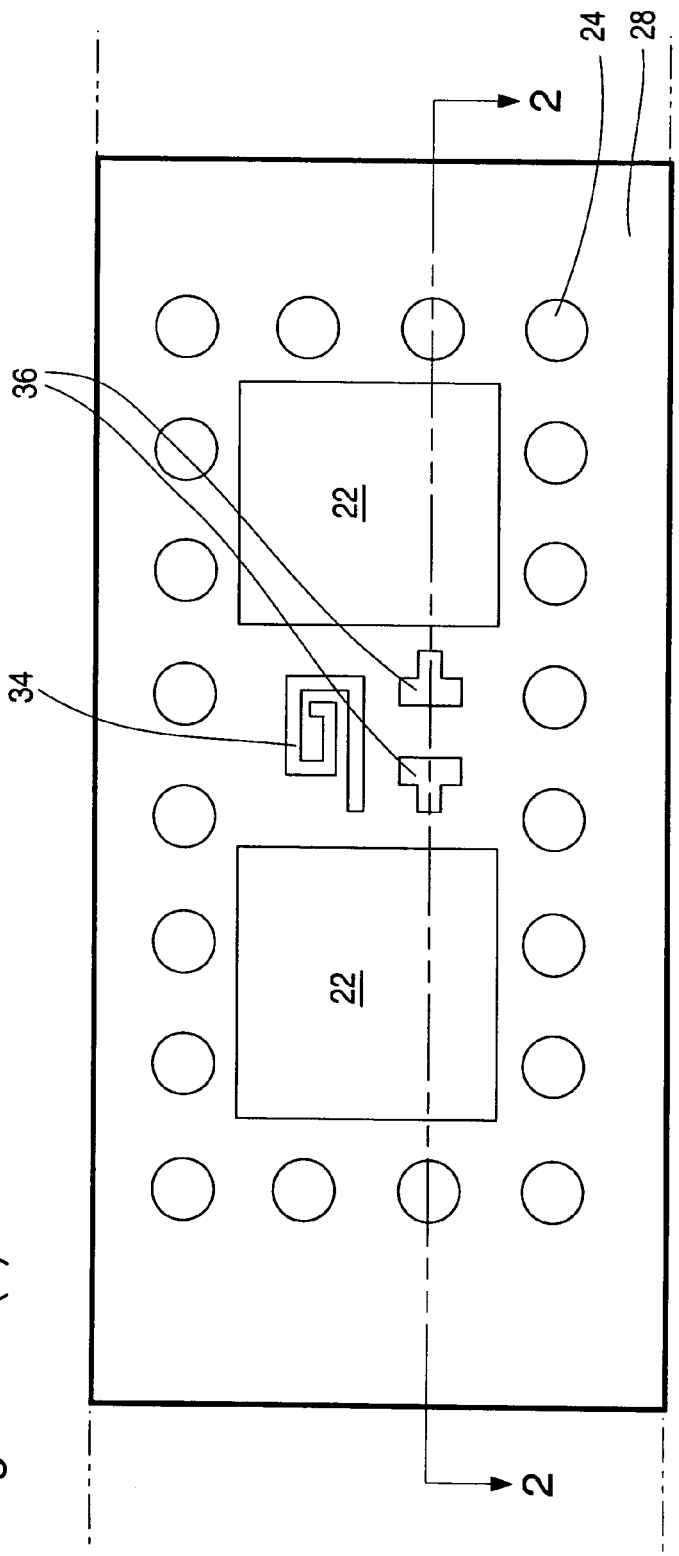
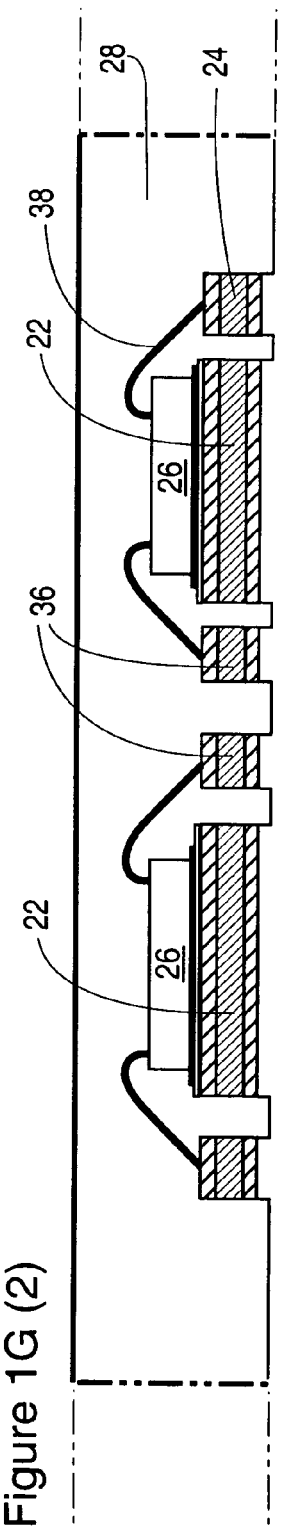
Figure 1G (1)
Figure 1G (2)

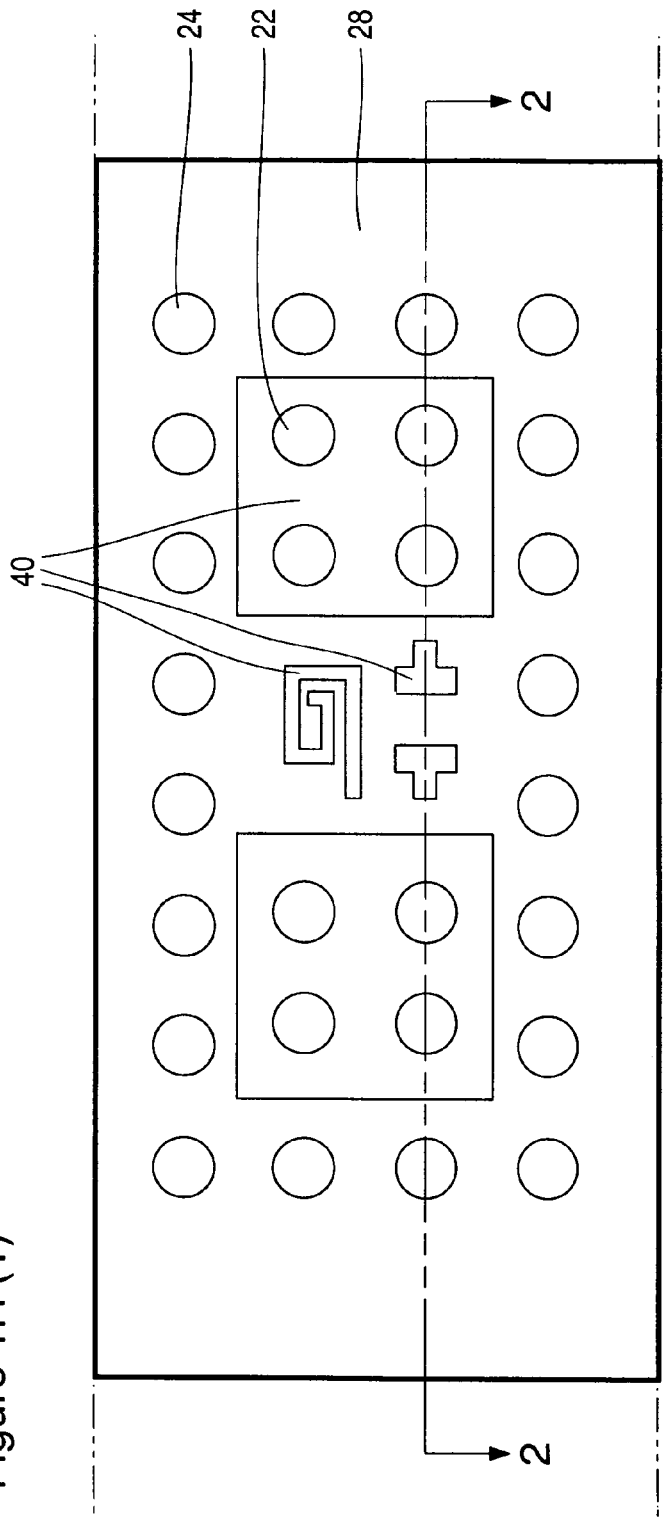
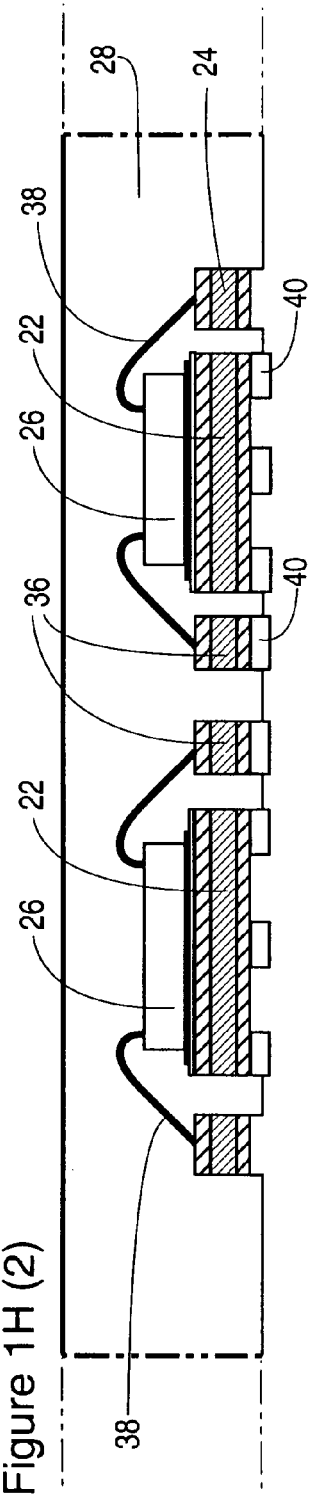
Figure 1H (1)
Figure 1H (2)

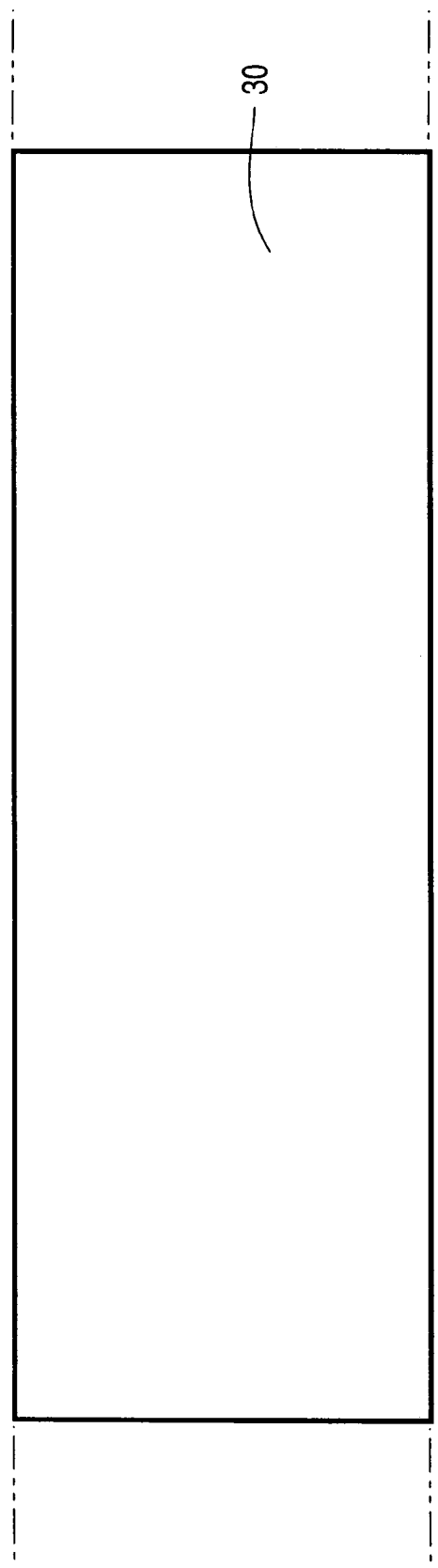
Figure 2A (1)
Figure 2A (2)

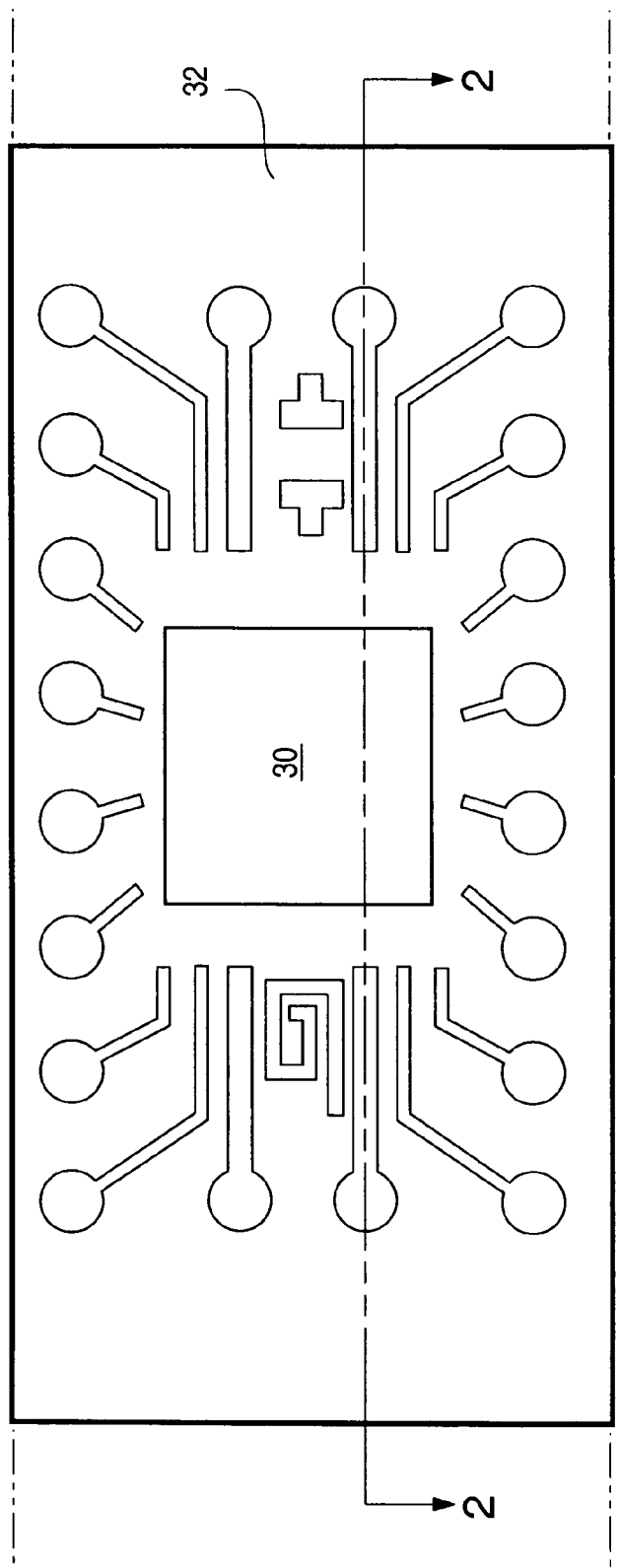
Figure 2B (1)
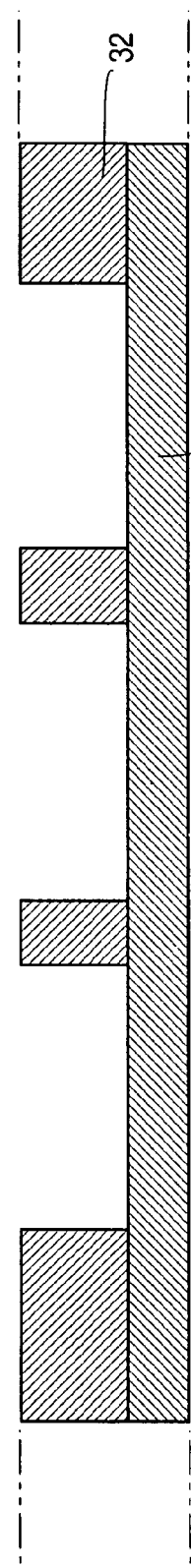
Figure 2B (2)

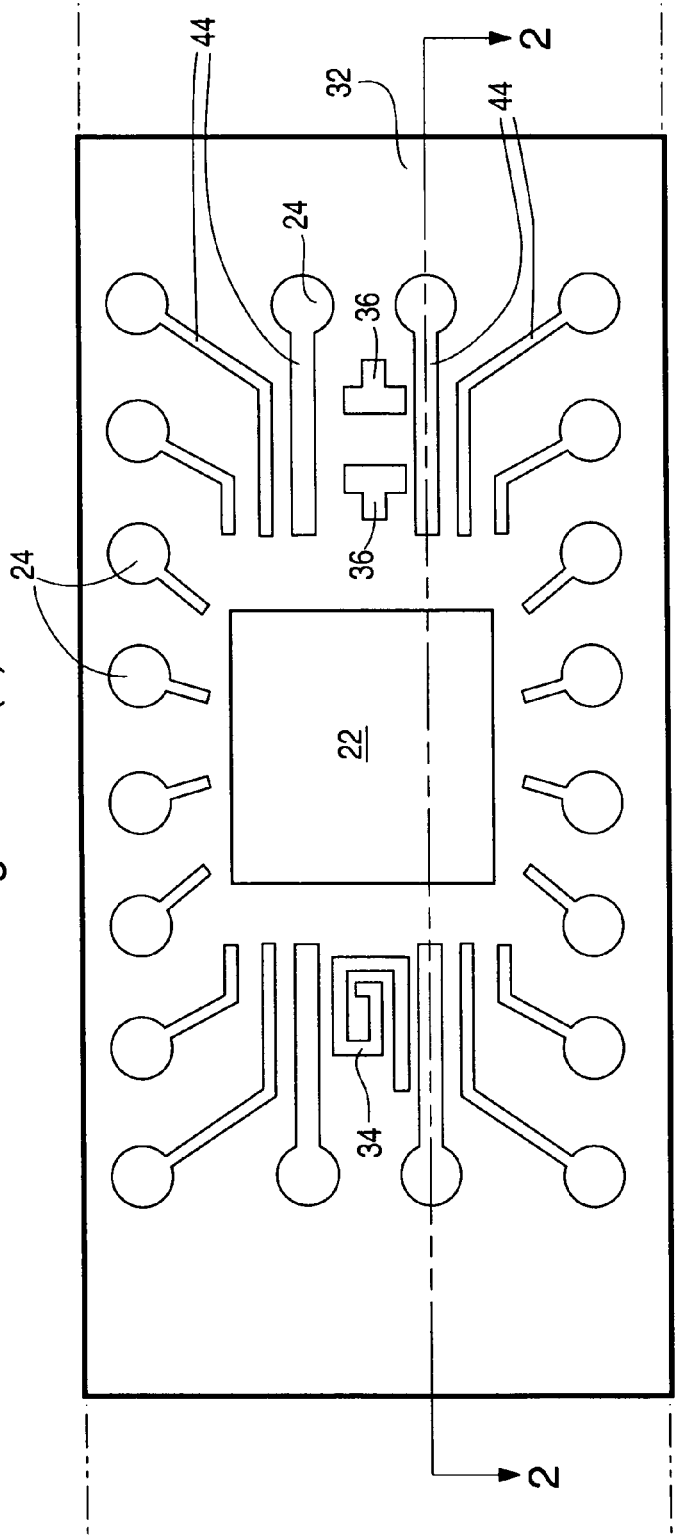
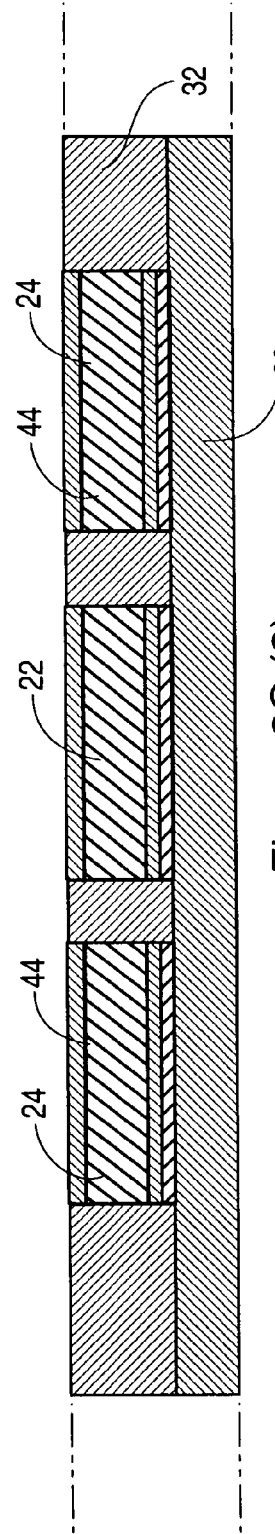
Figure 2C (1)
Figure 2C (2)

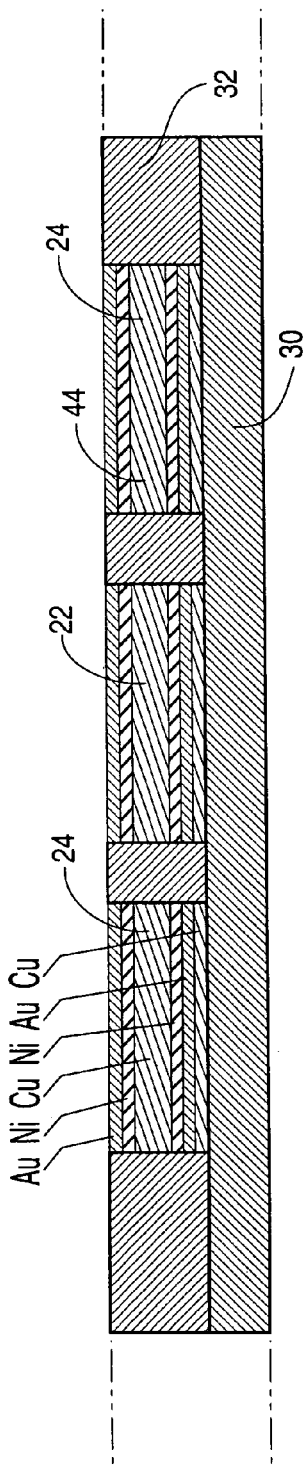
Figure 2C (3)
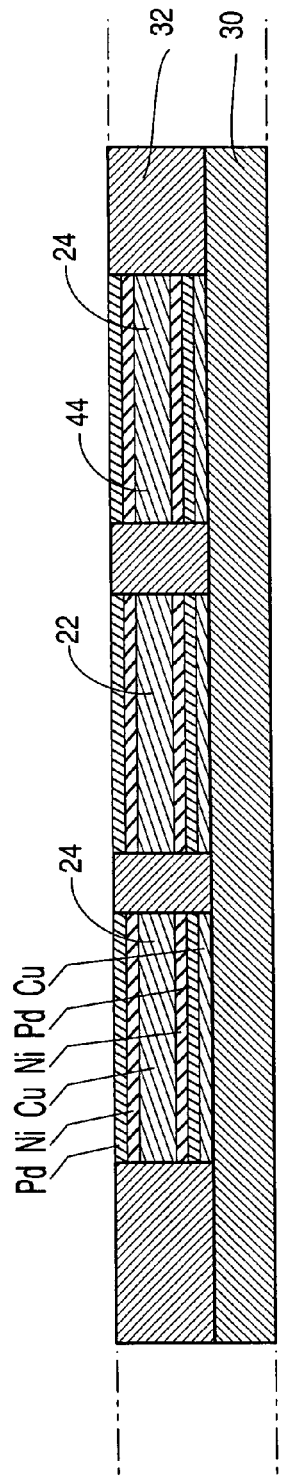
Figure 2C (4)
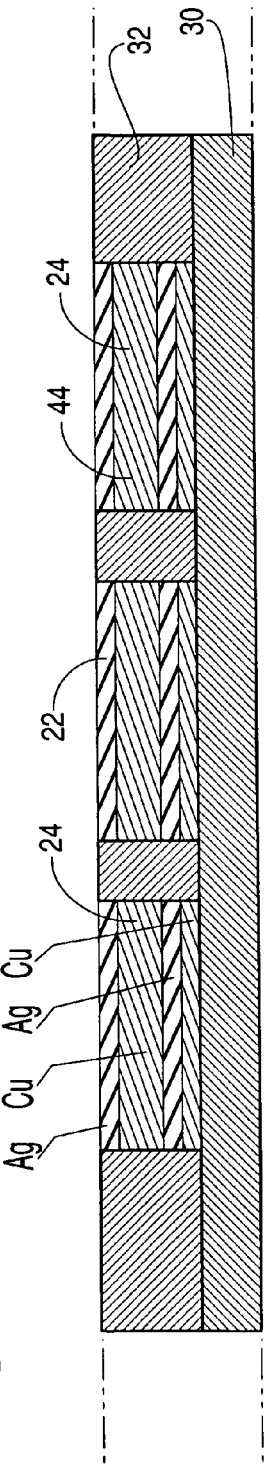
Figure 2C (5)

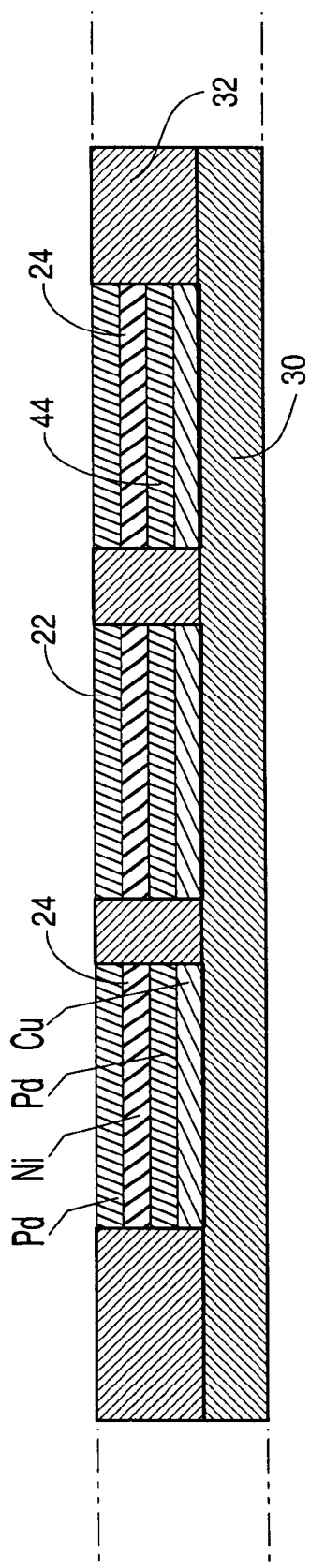
Figure 2C (6)
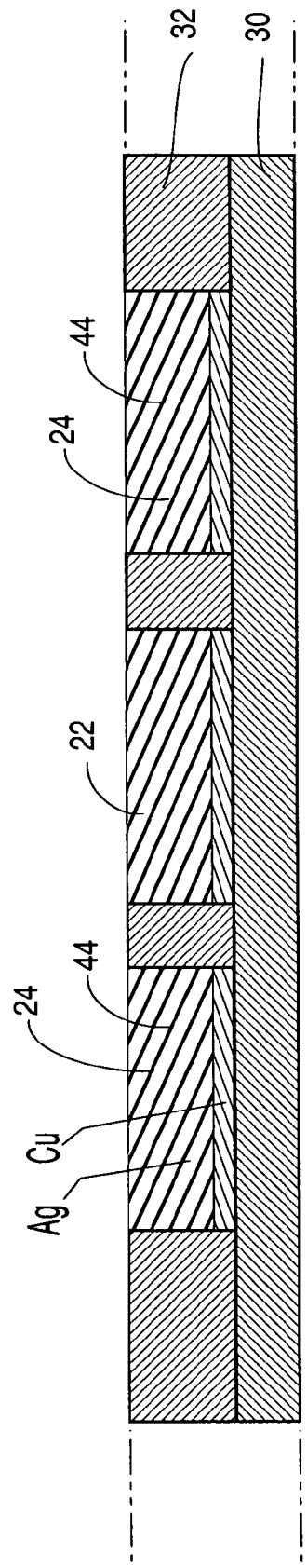
Figure 2C (7)

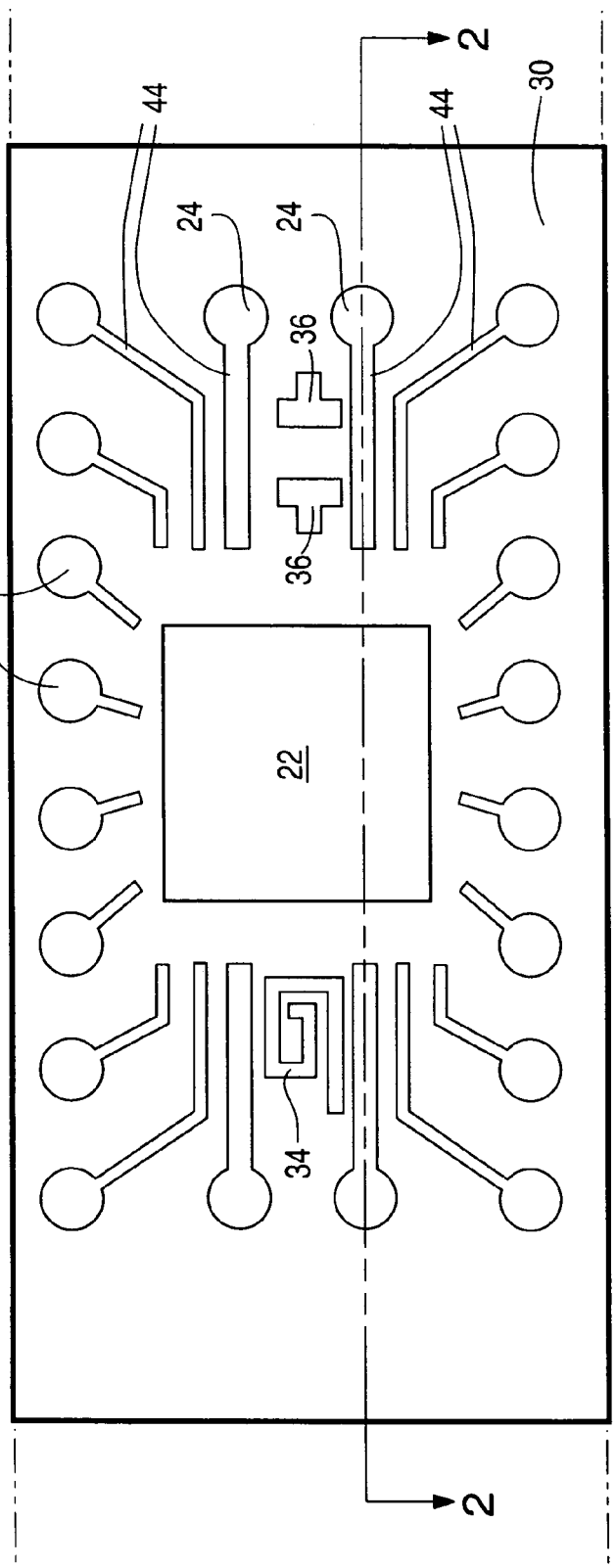
Figure 2D (1)
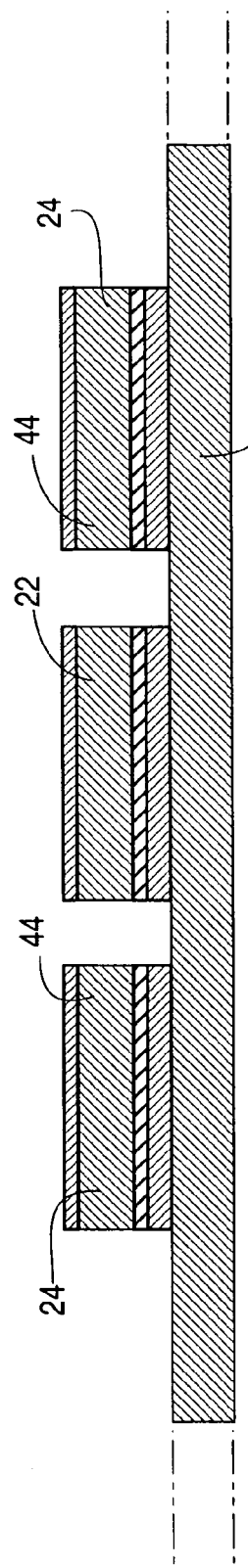
Figure 2D (2)

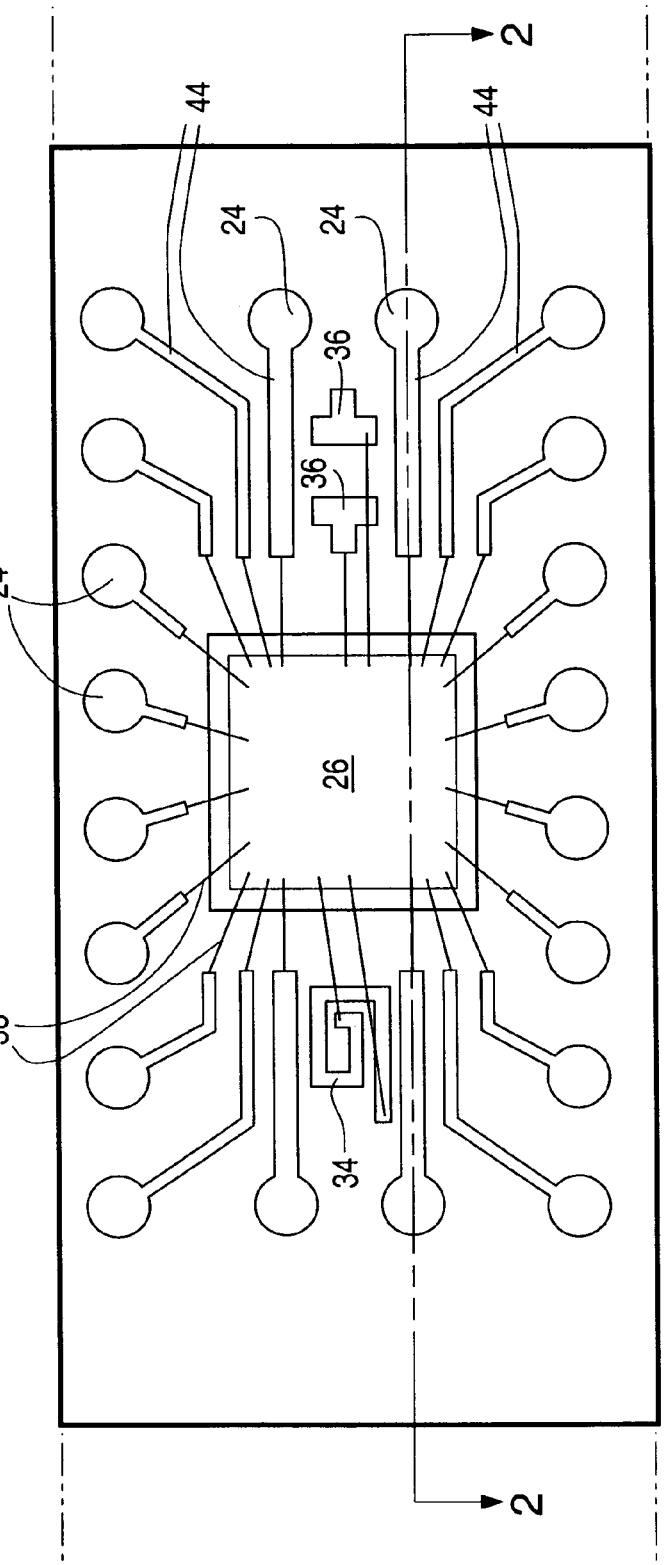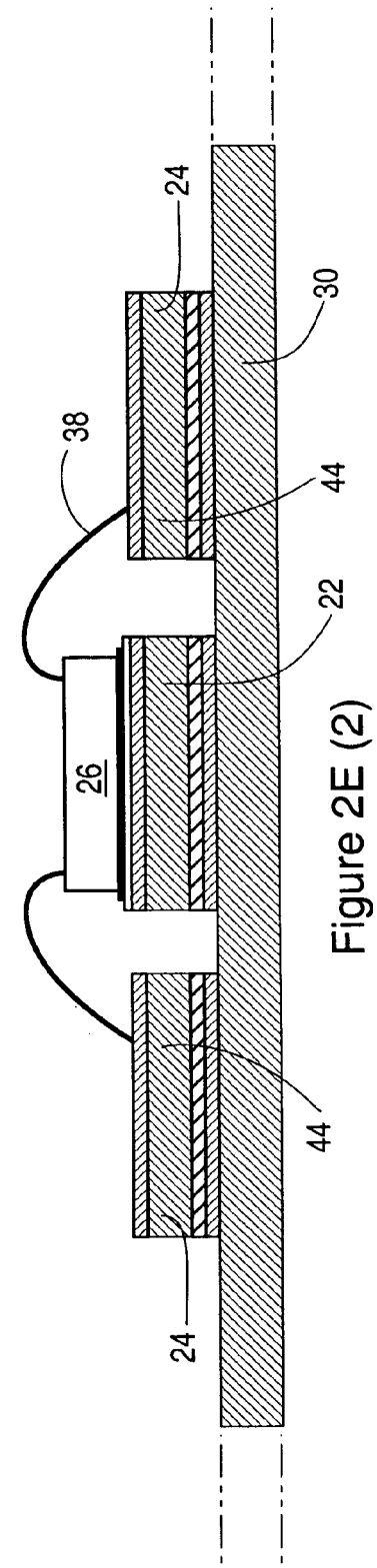

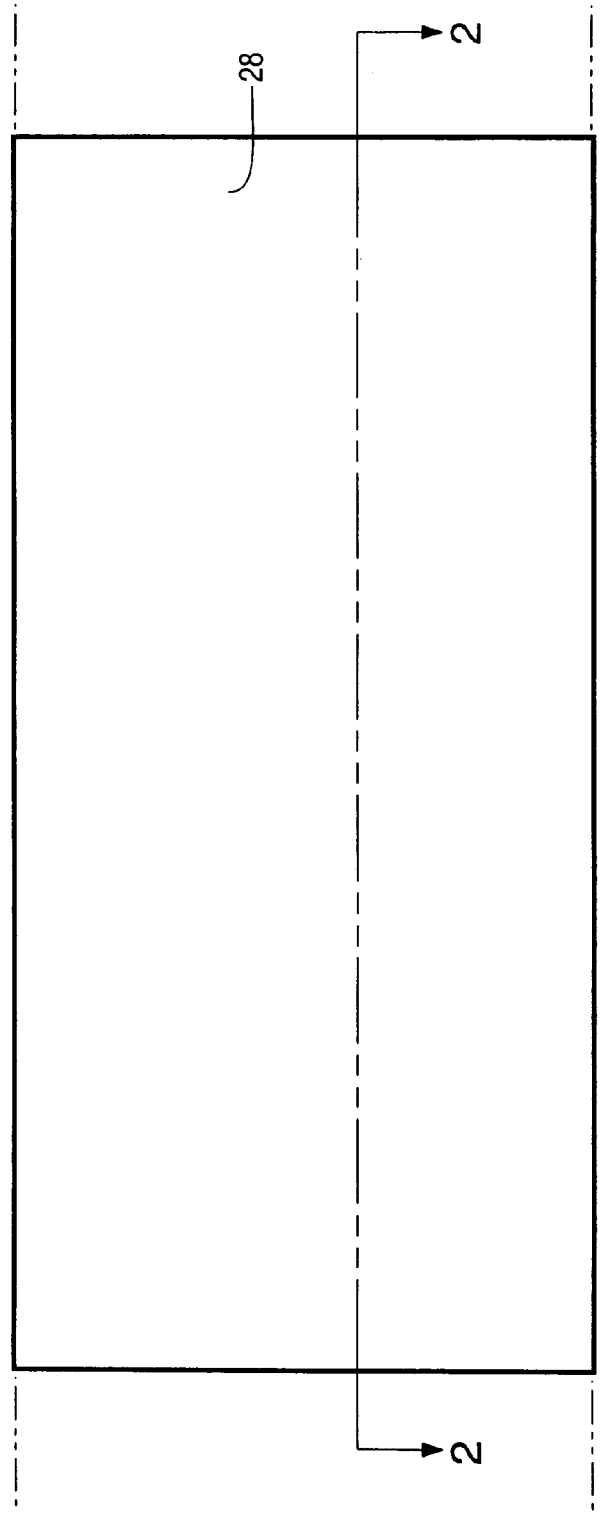
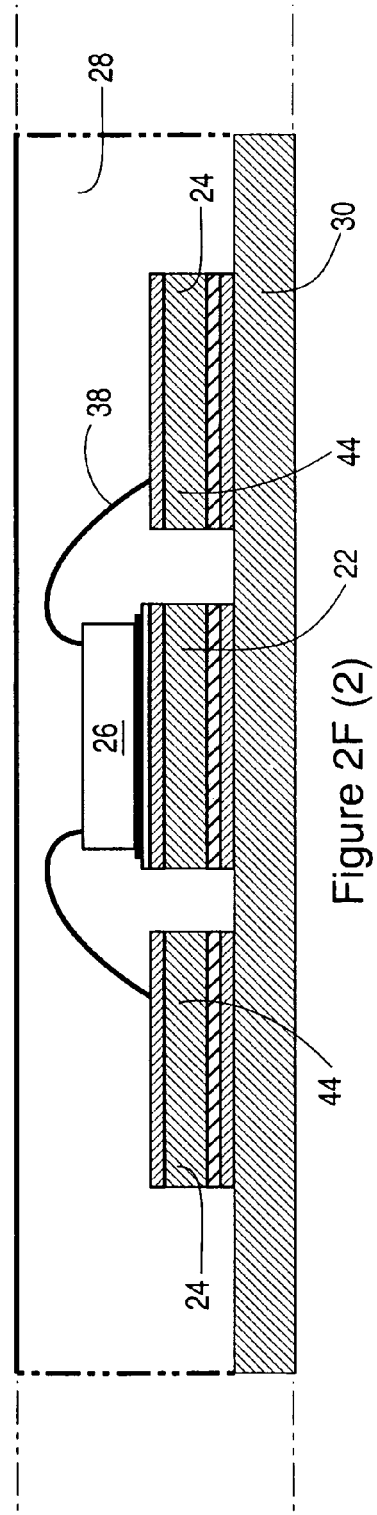

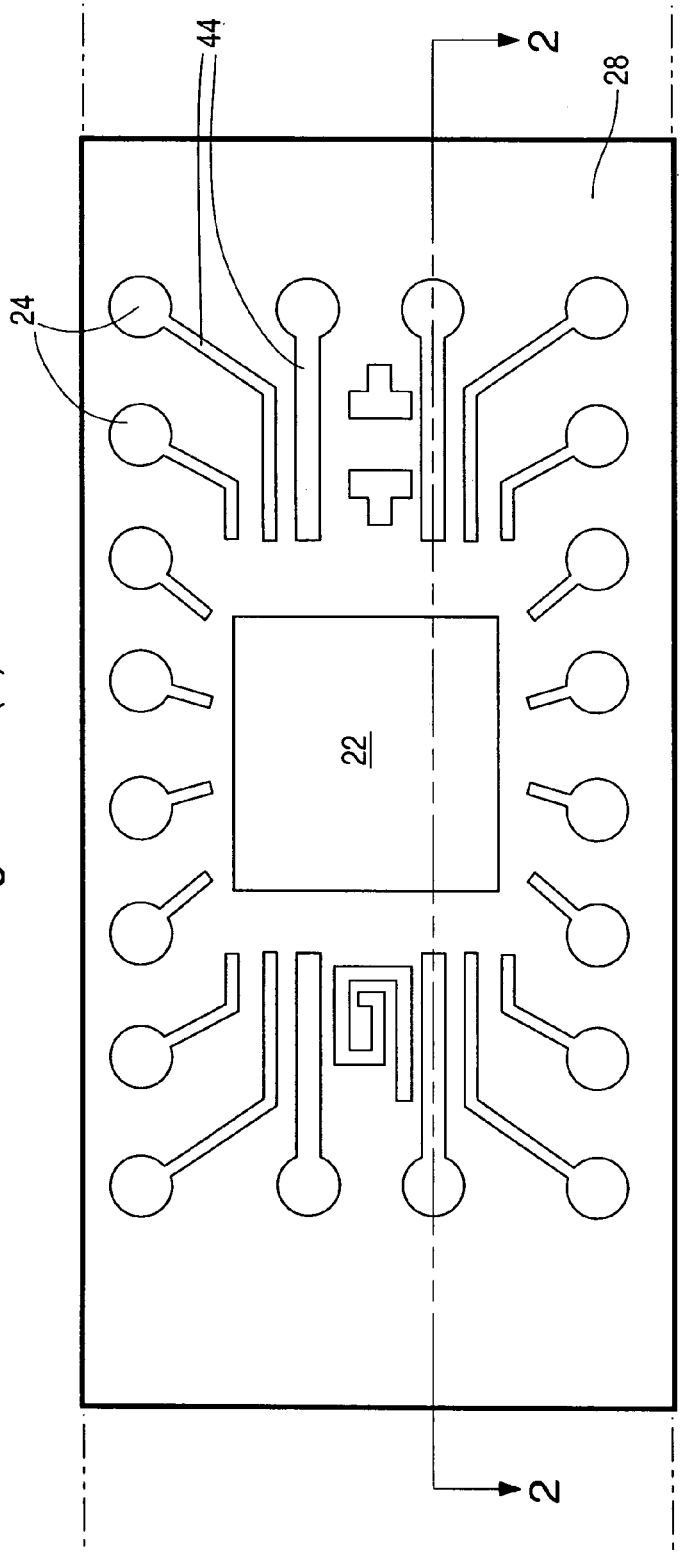
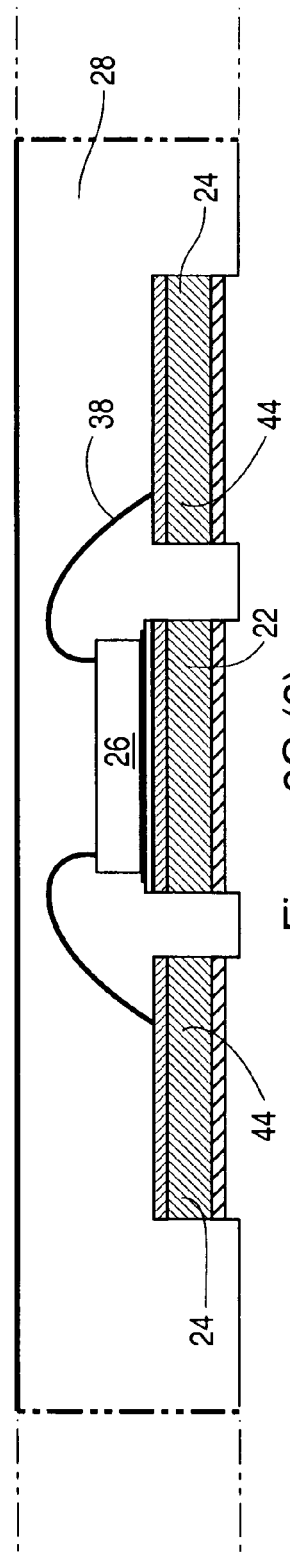
Figure 2G (1)
Figure 2G (2)

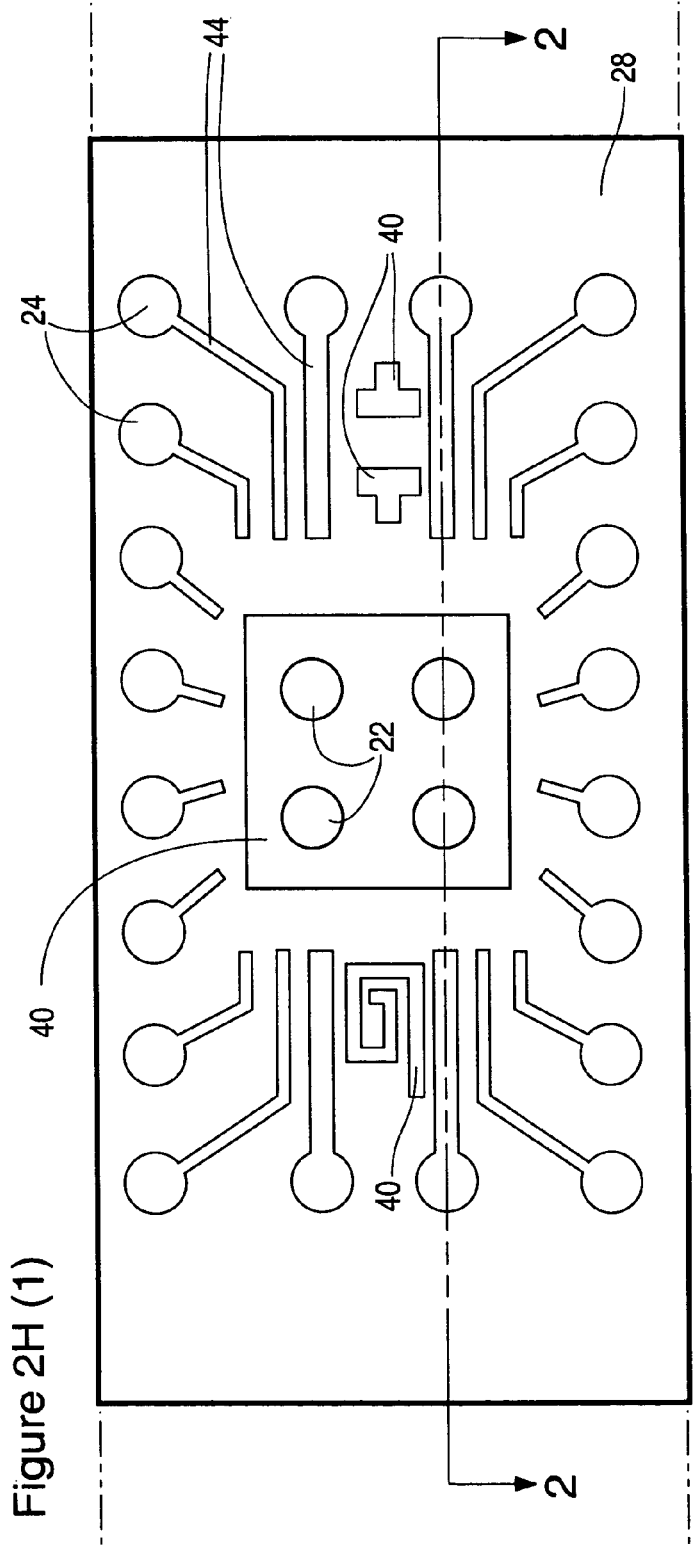
Figure 2H (1)
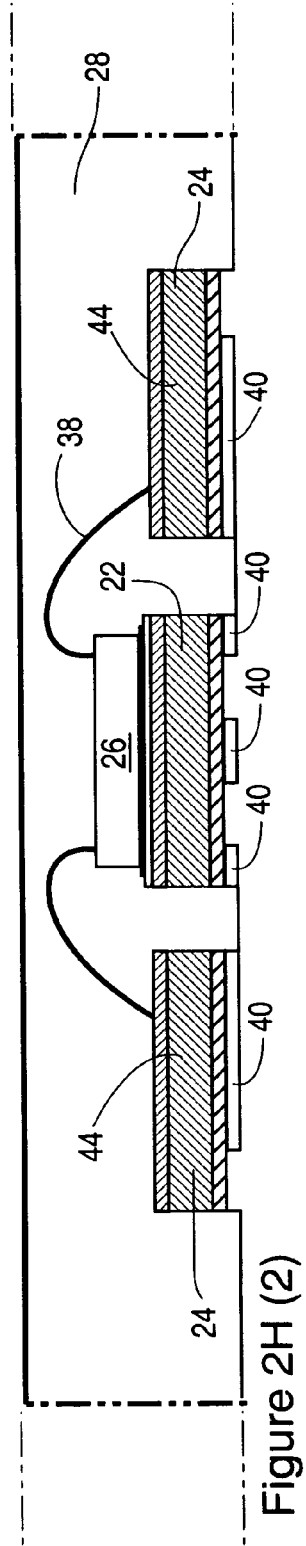
Figure 2H (2)

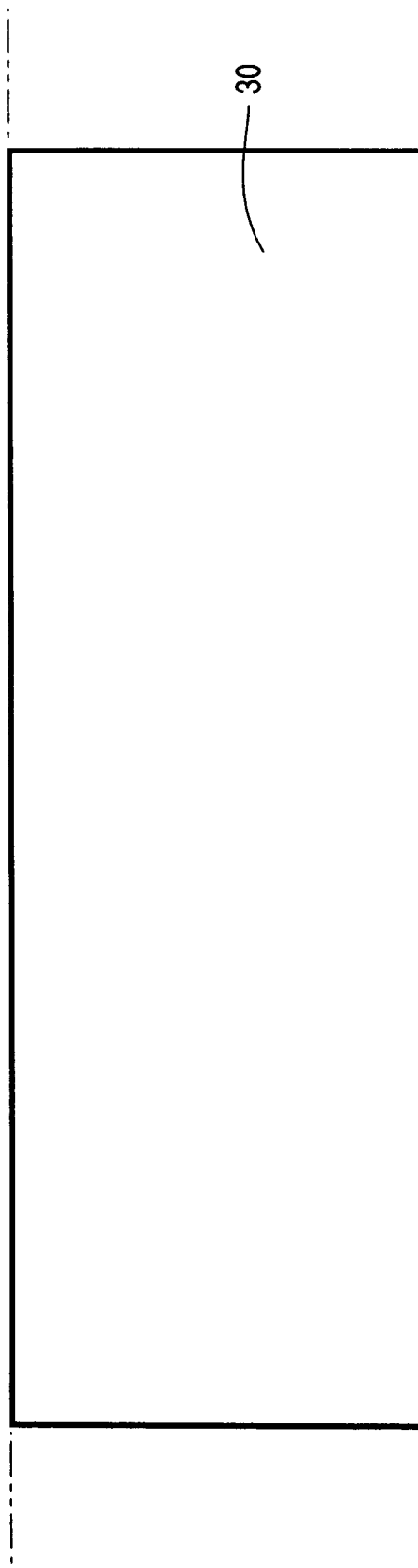
Figure 3A (1)
Figure 3A (2)

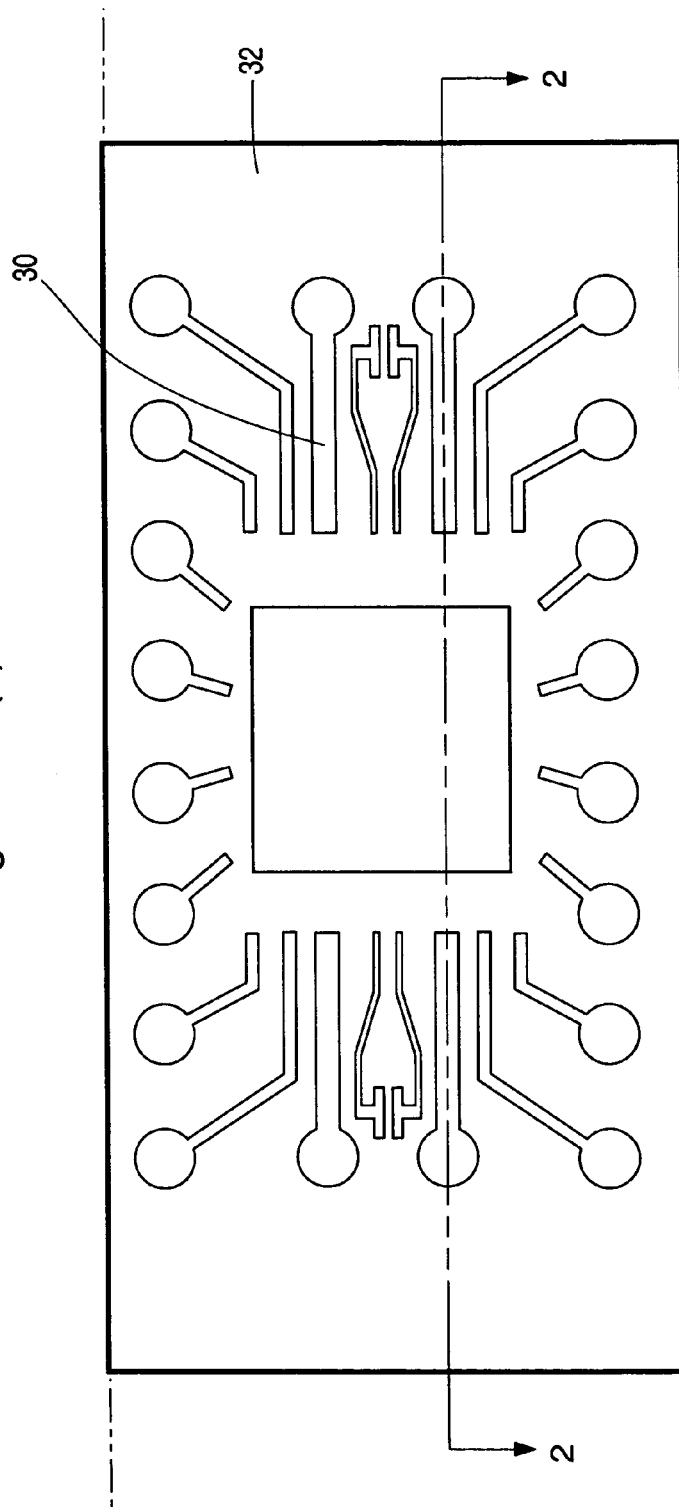
Figure 3B (1)
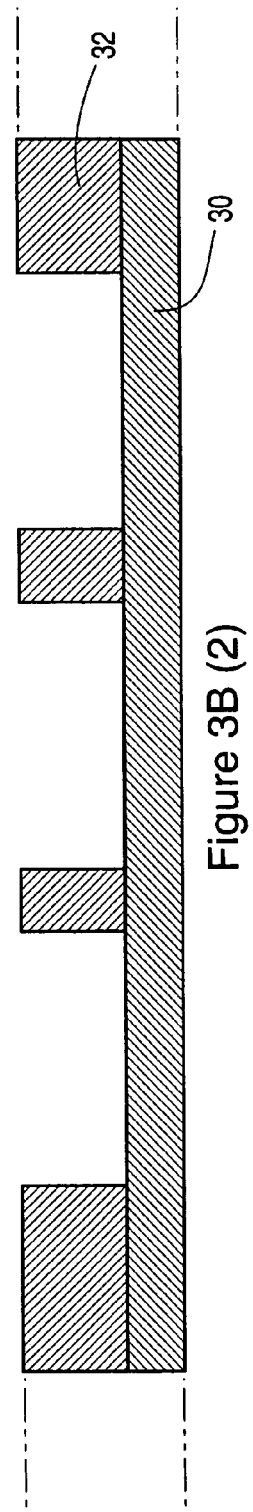
Figure 3B (2)

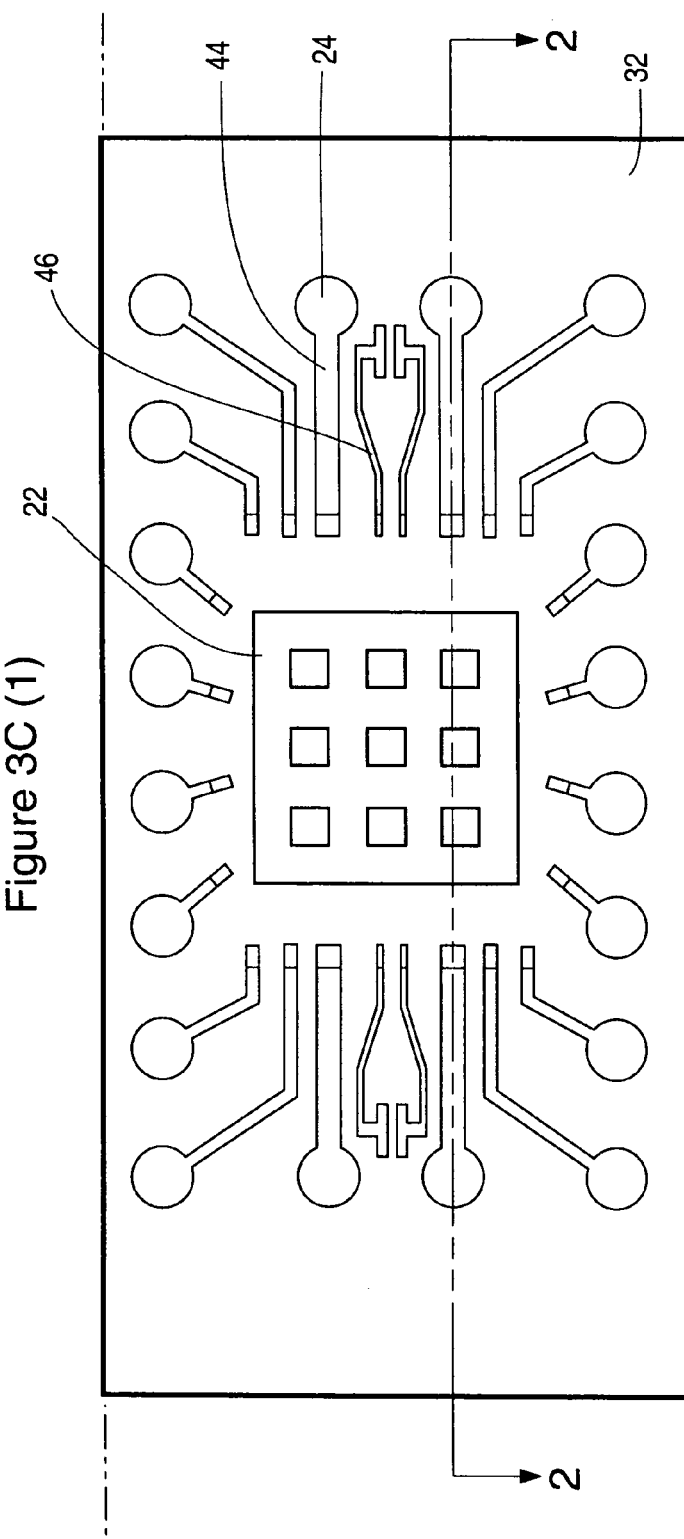

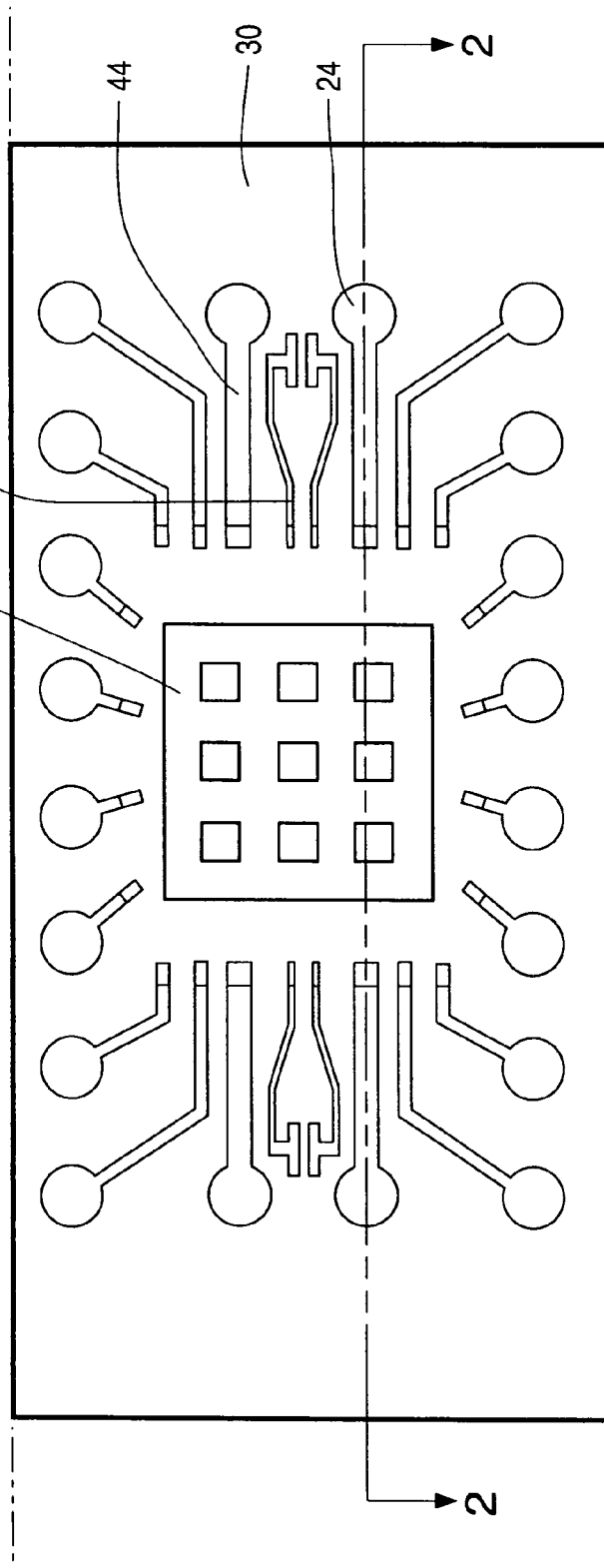
Figure 3D (1)
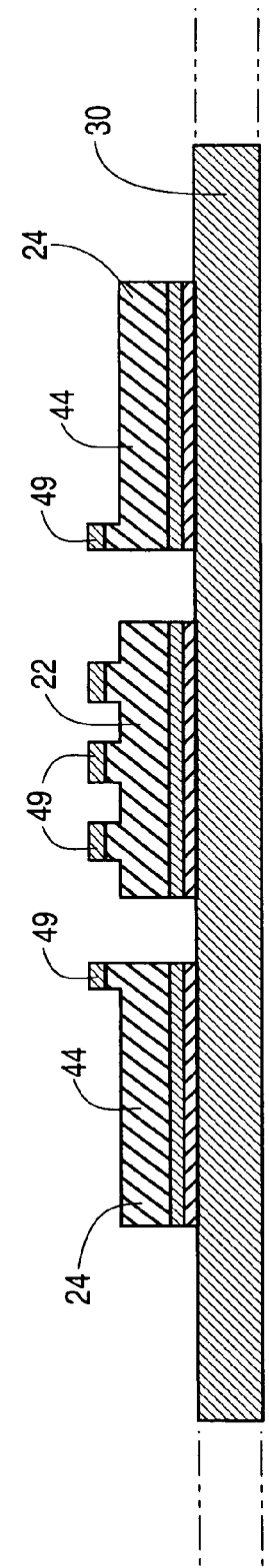
Figure 3D (2)

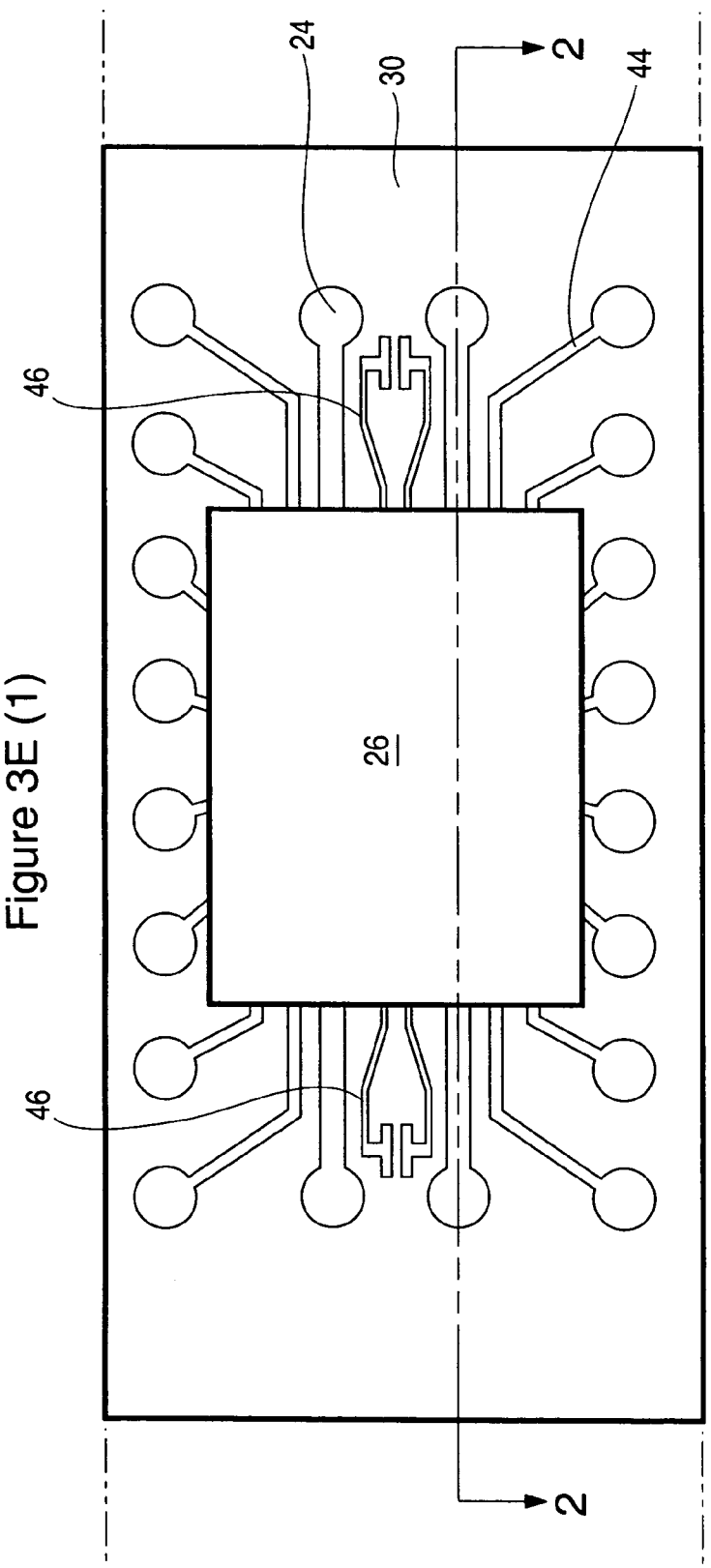

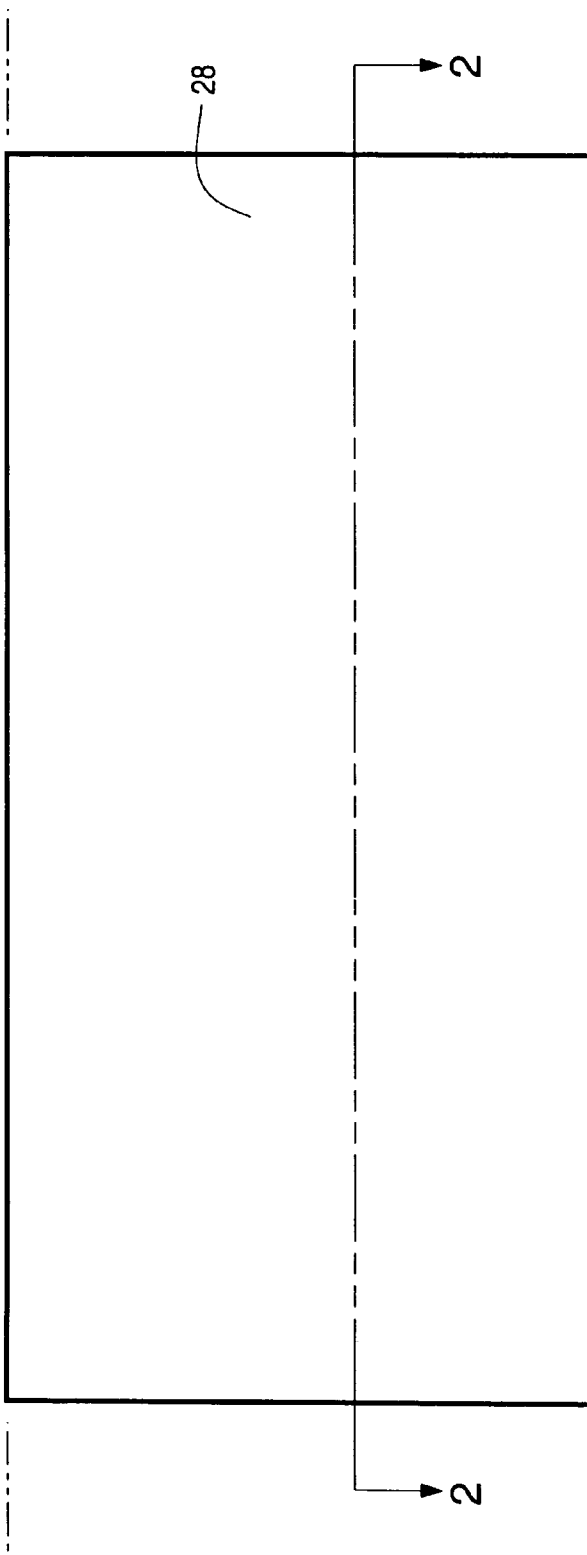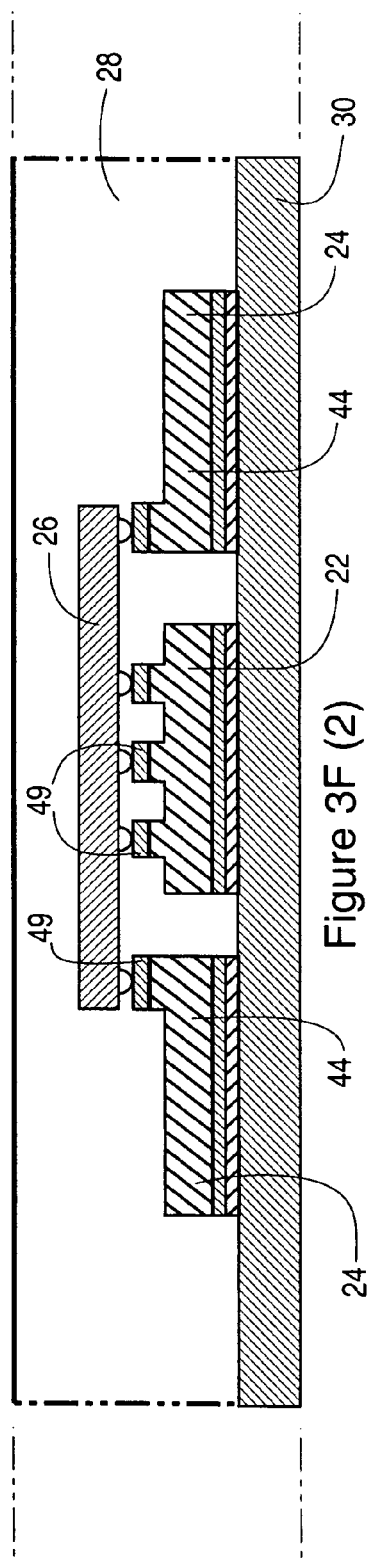

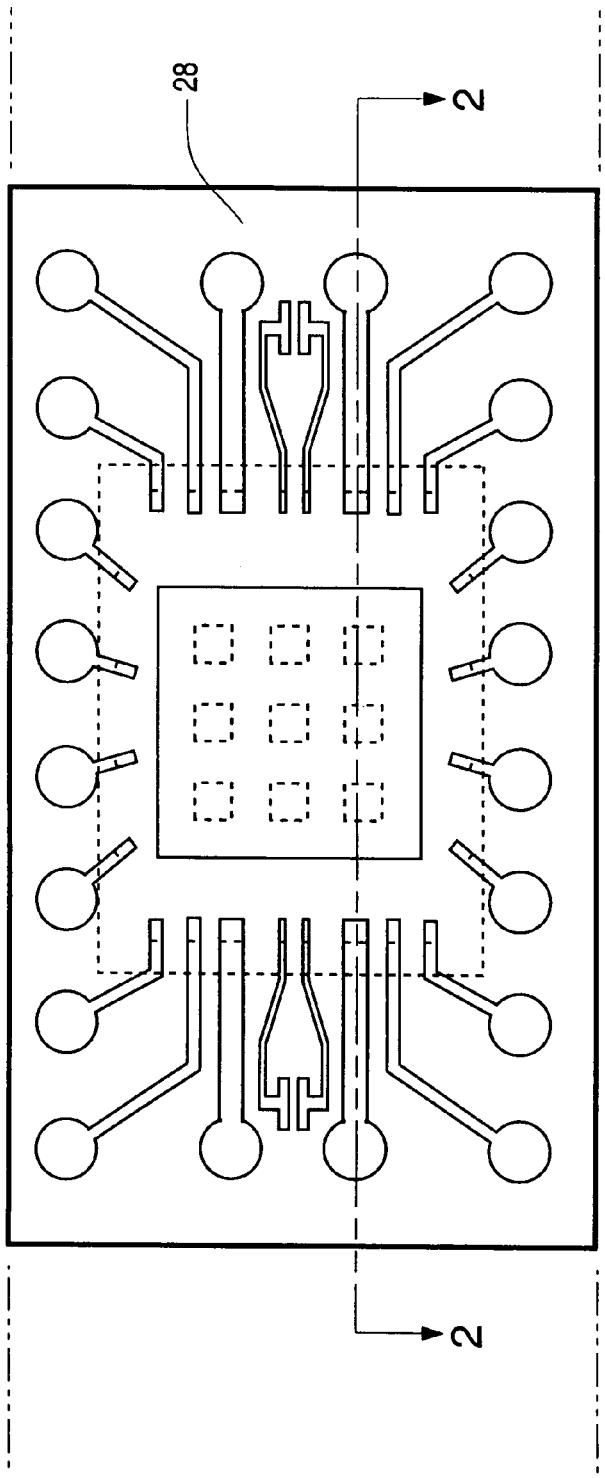
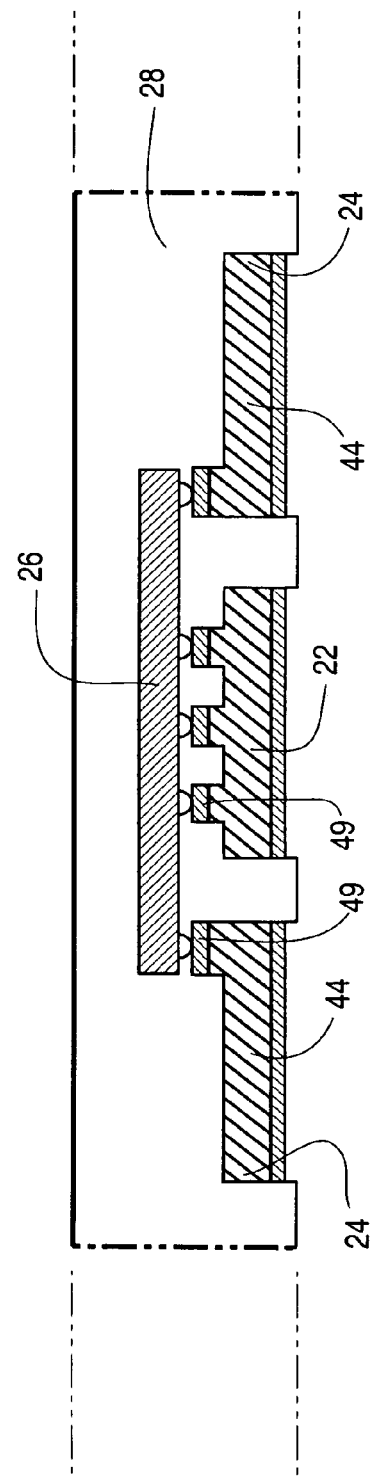

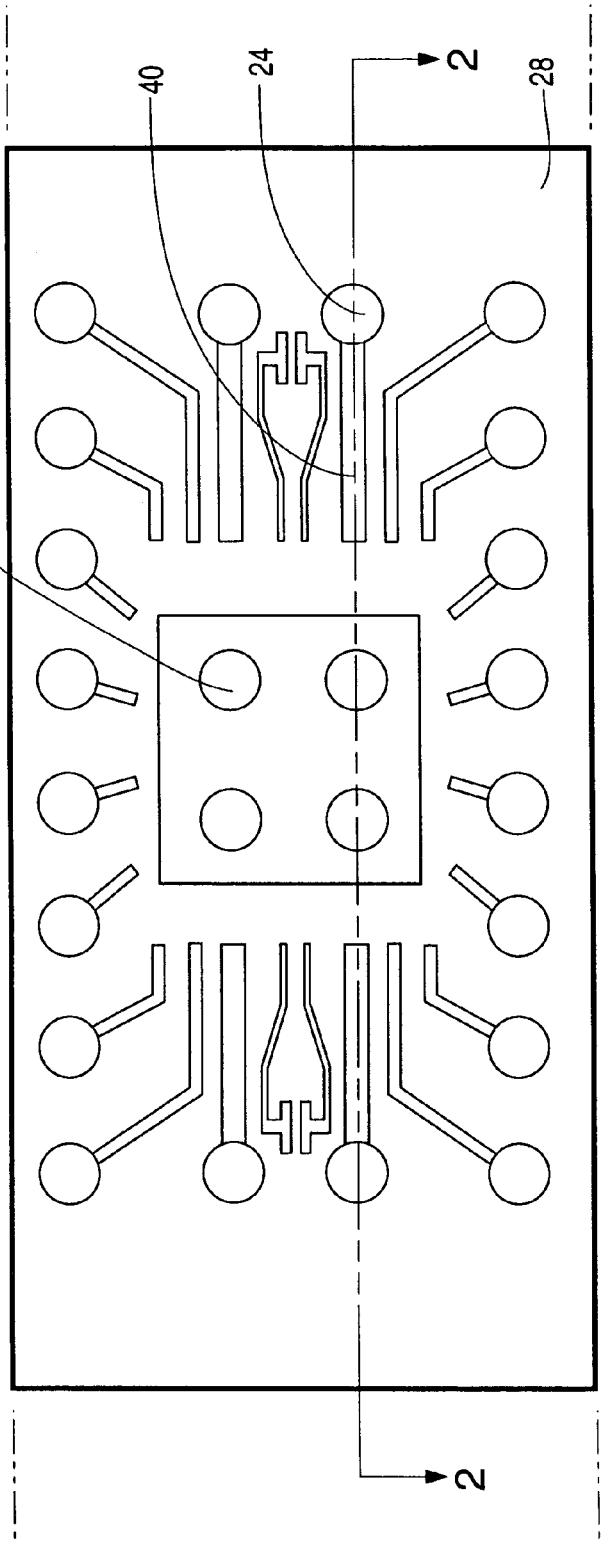
Figure 3H (1)
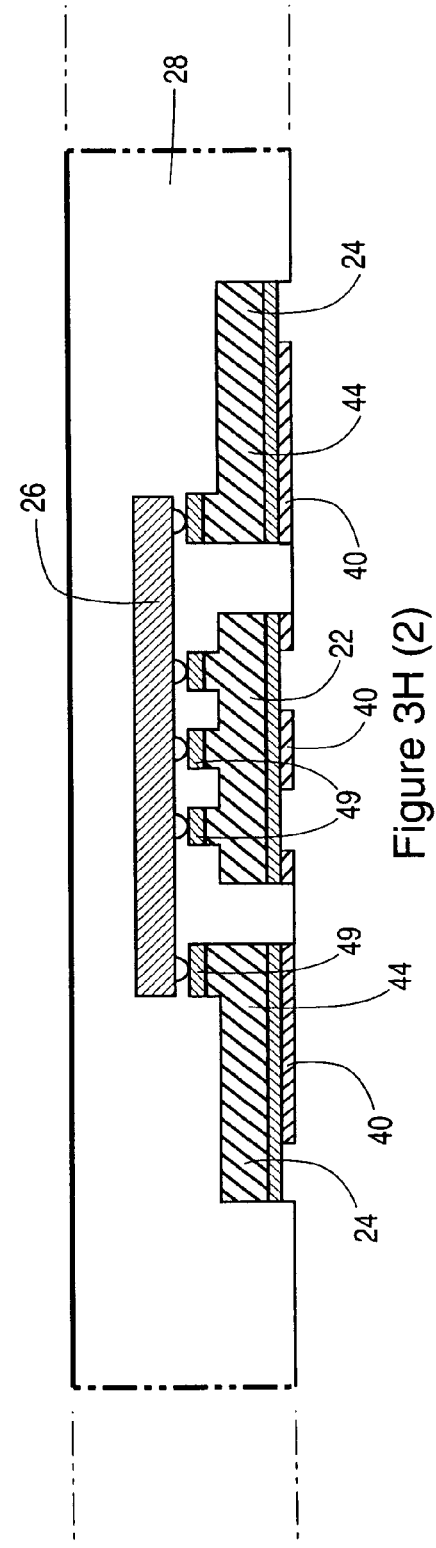
Figure 3H (2)

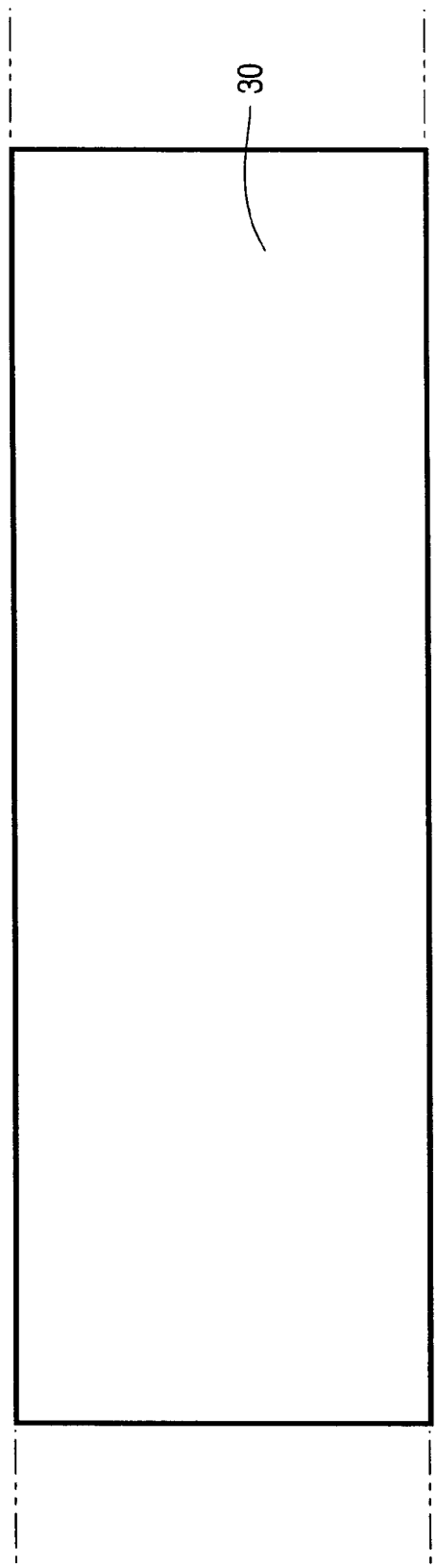
Figure 4A (1)
Figure 4A (2)

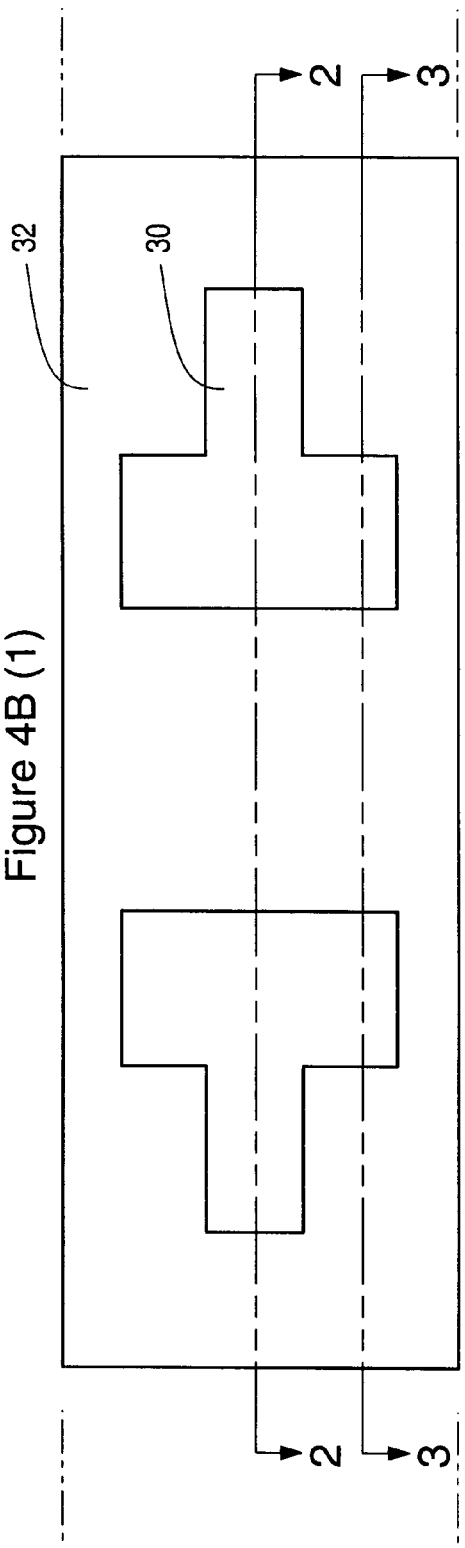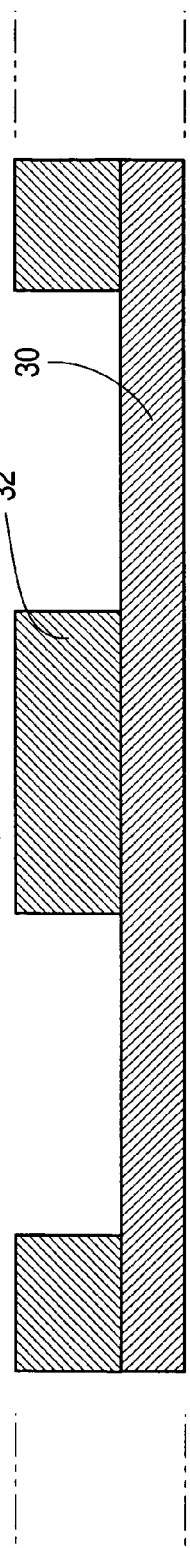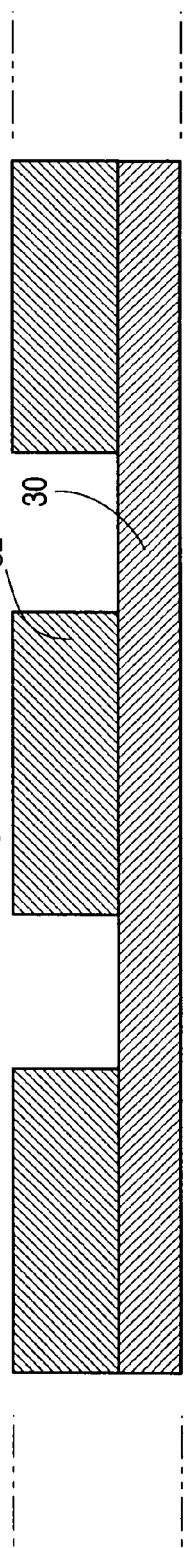

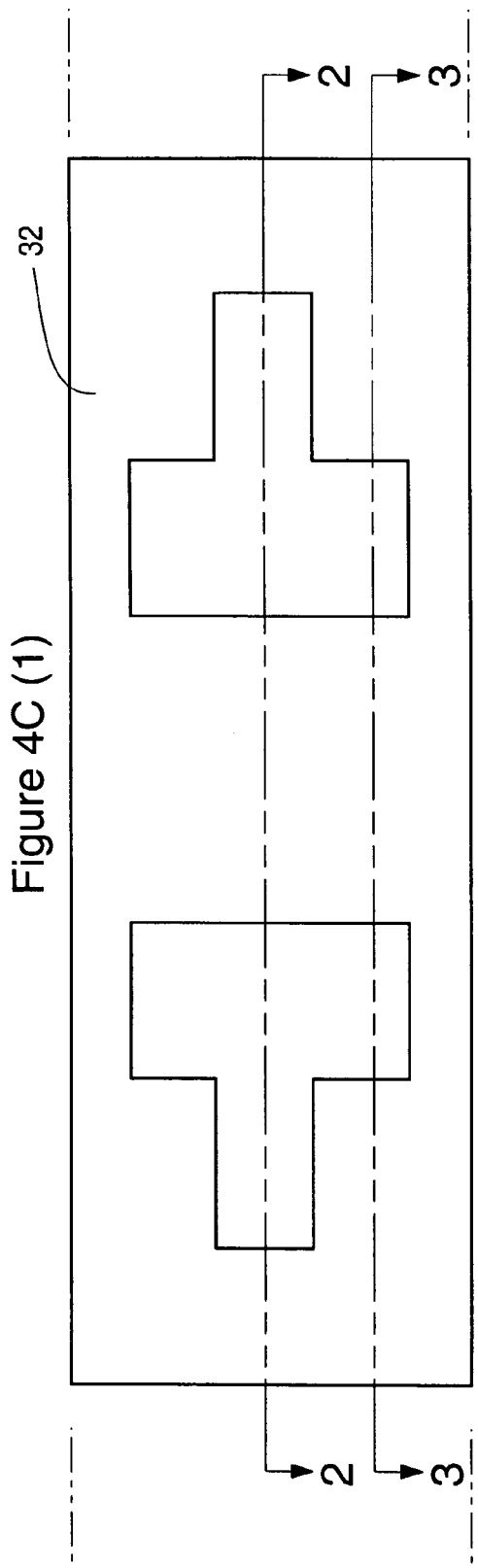
Figure 4C (1)
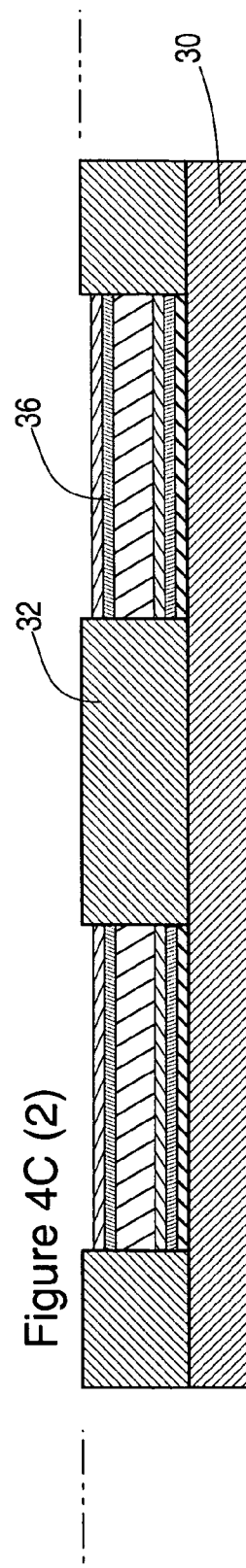
Figure 4C (2)
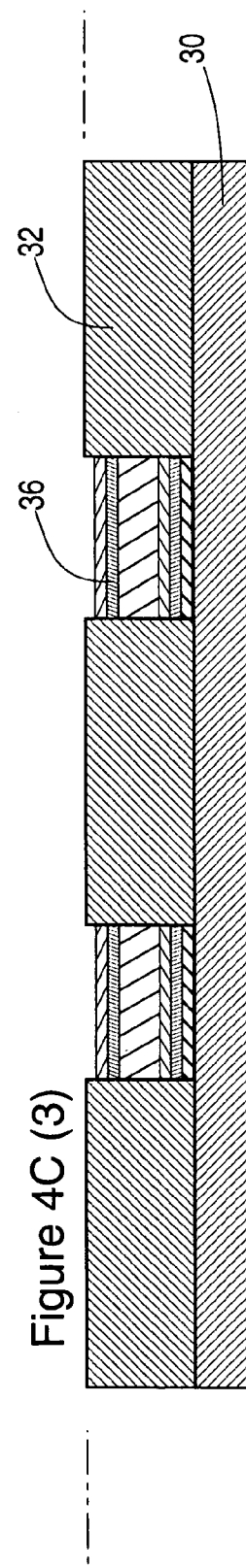
Figure 4C (3)

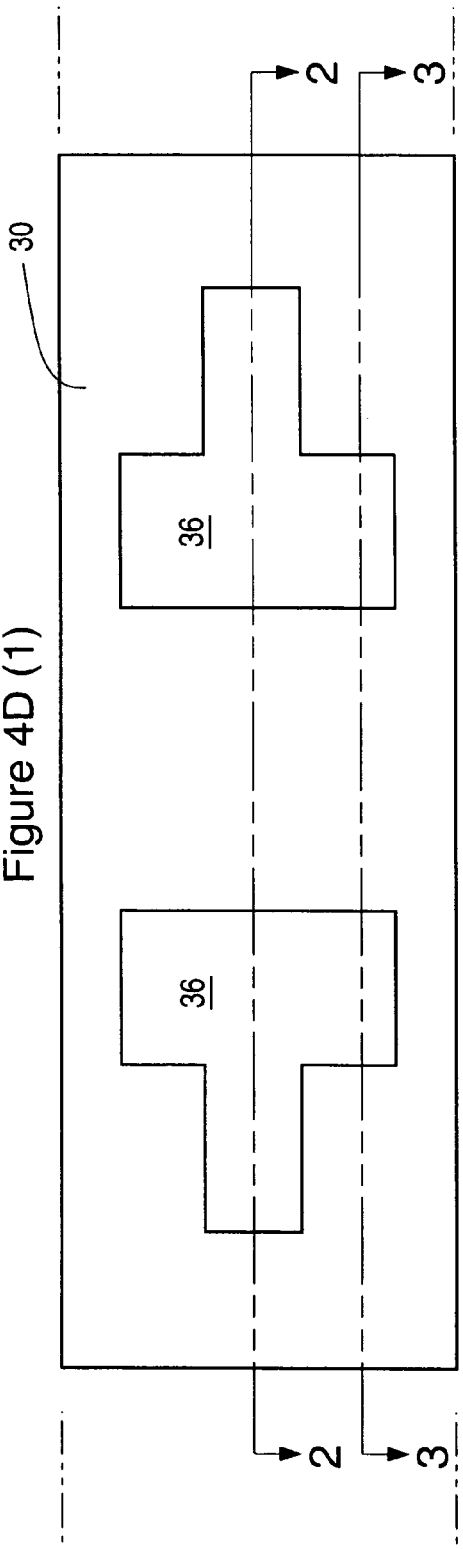
Figure 4D (1)
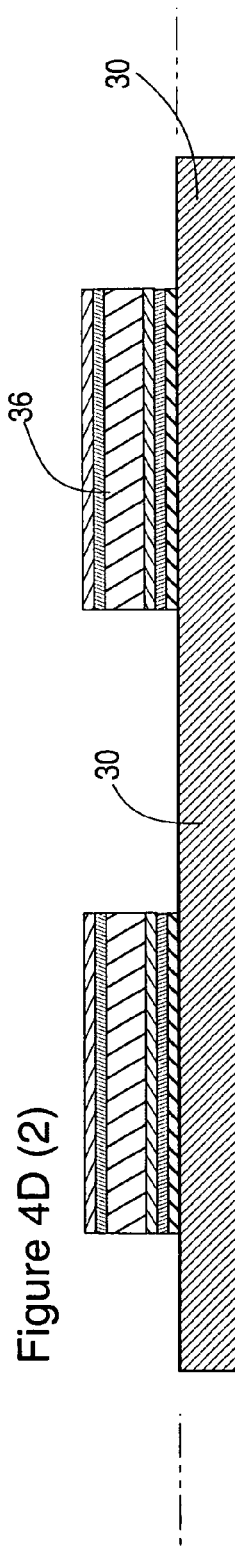
Figure 4D (2)
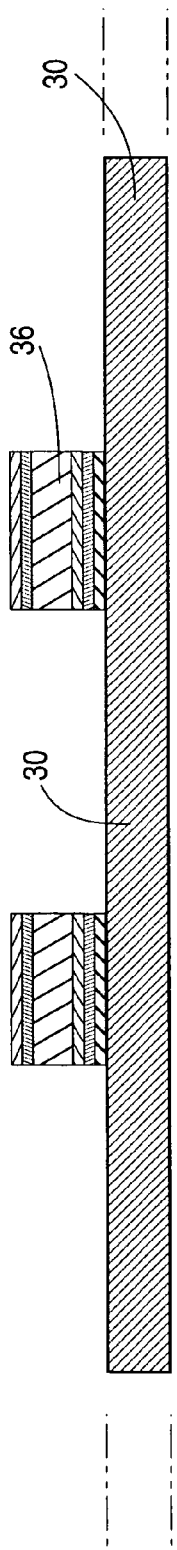
Figure 4D (3)

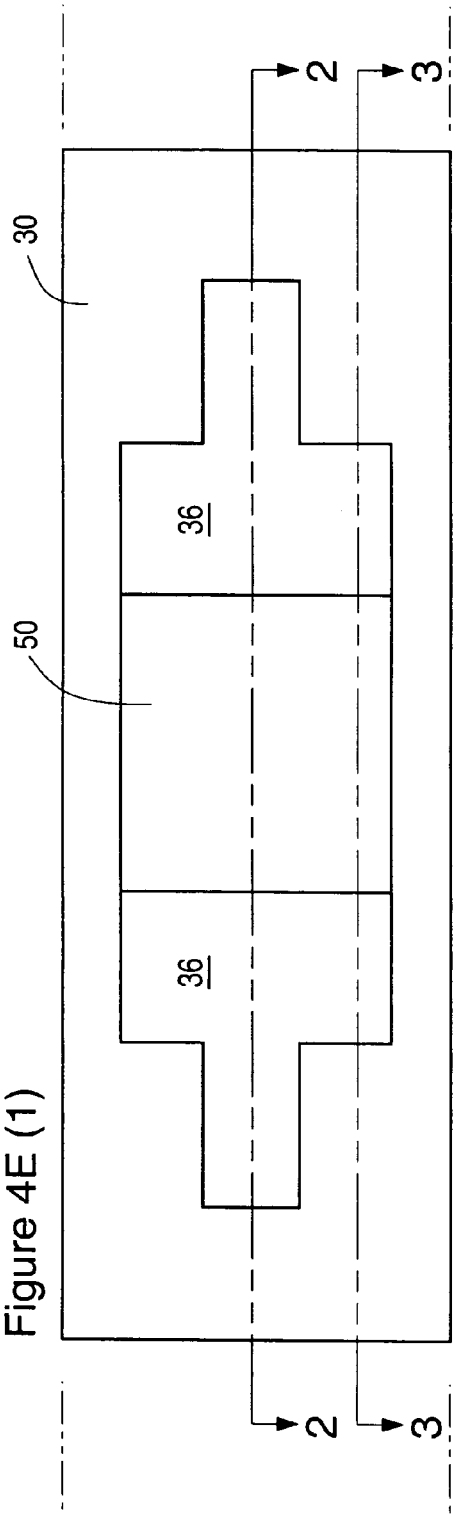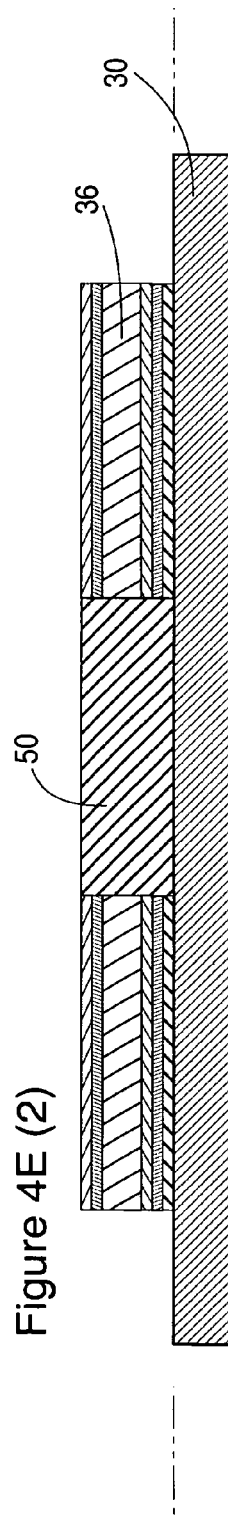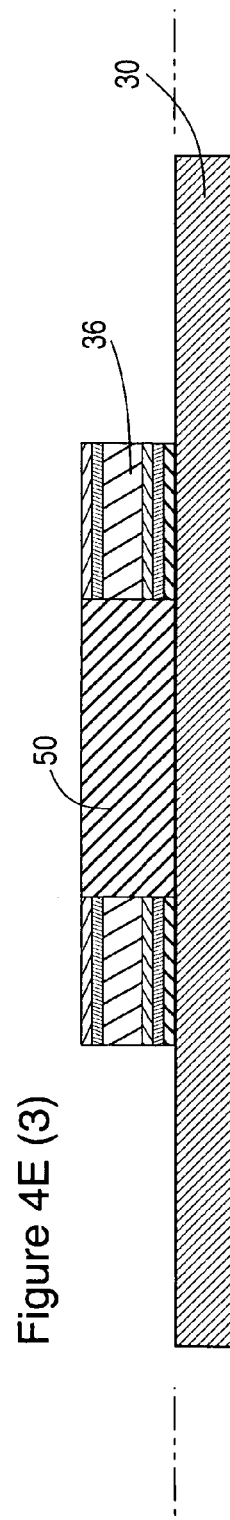

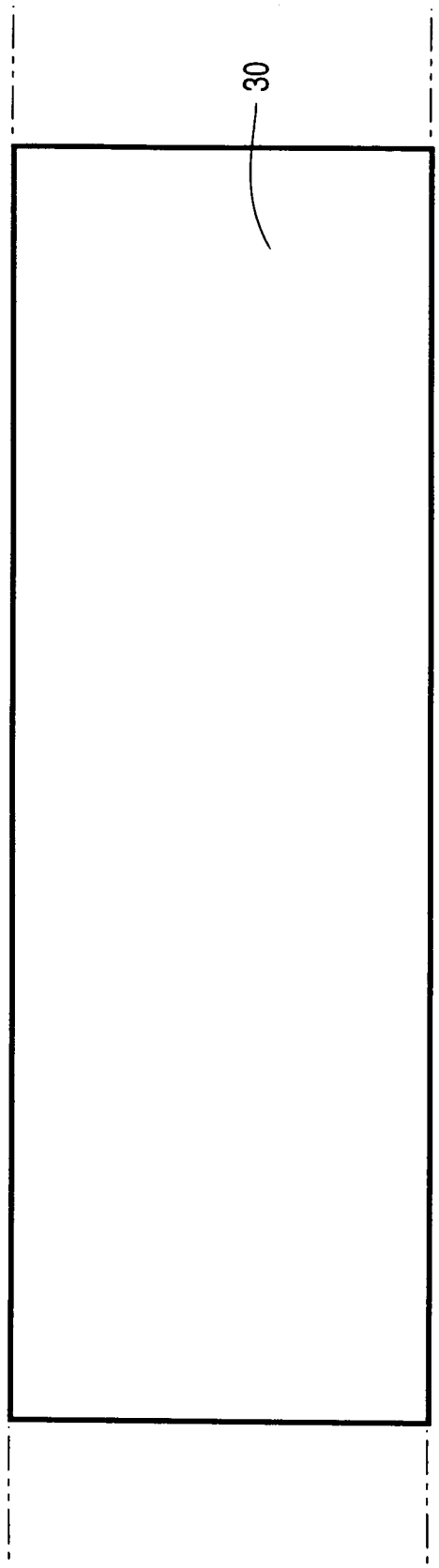
Figure 5A (1)
Figure 5A (2)

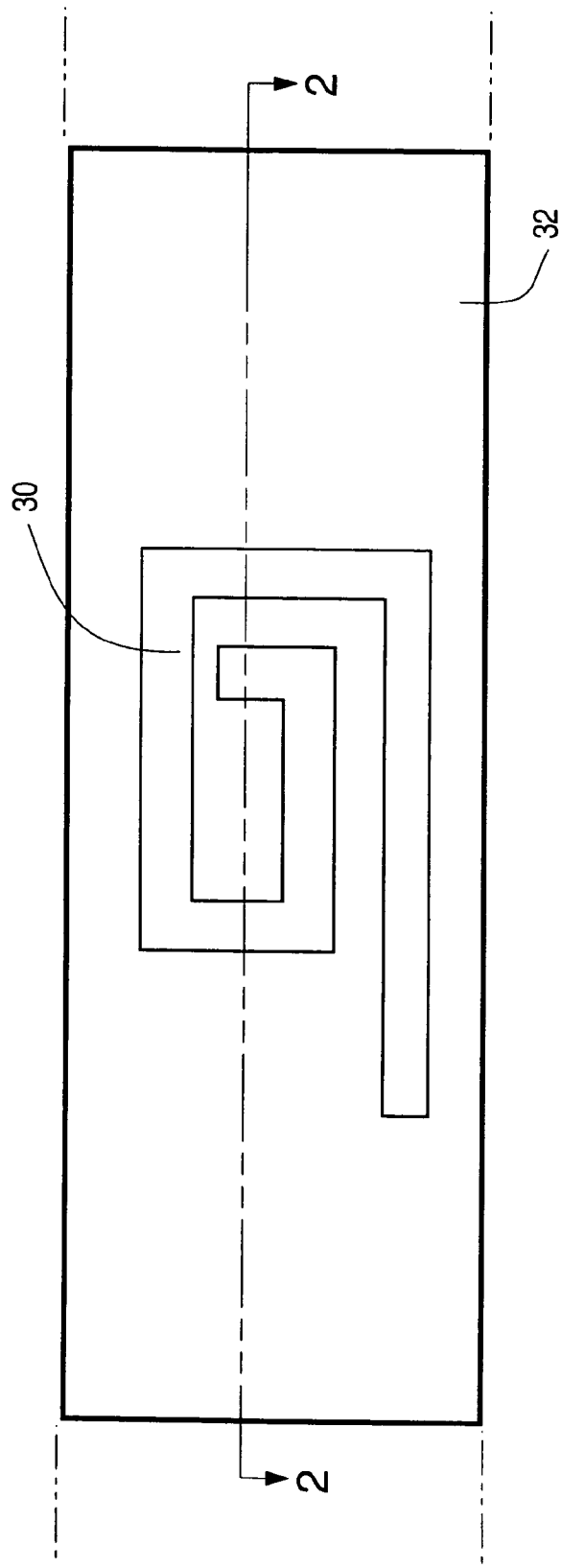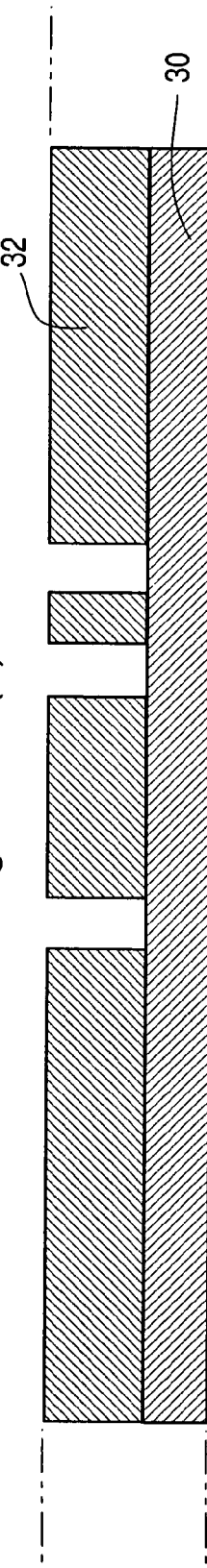

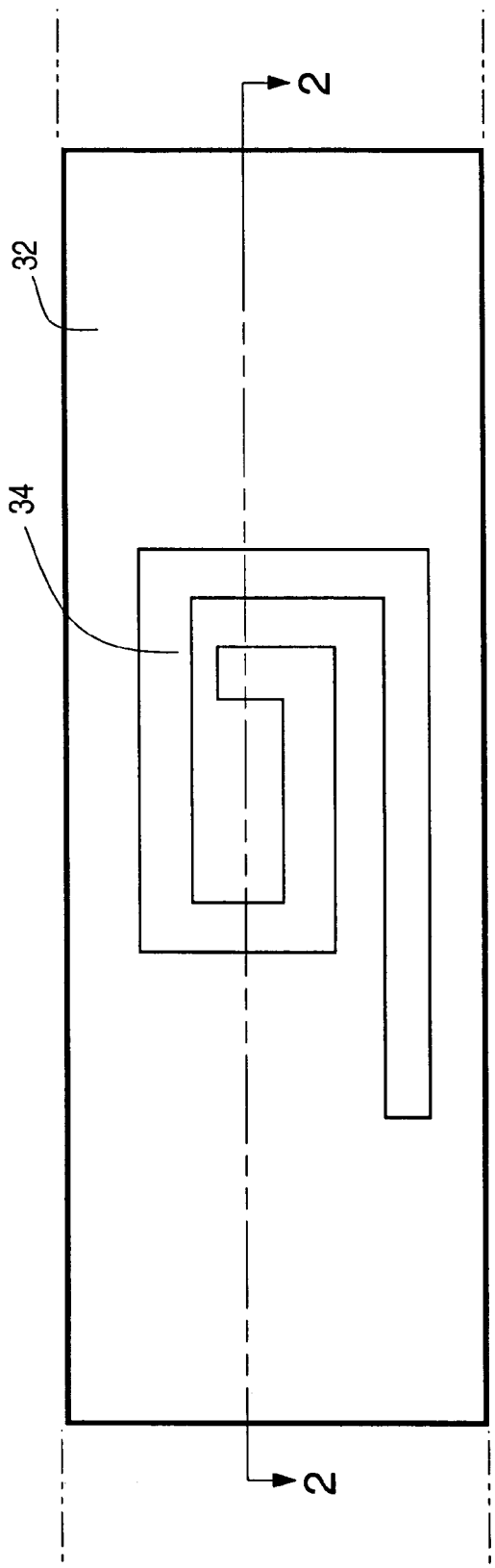
Figure 5C (1)
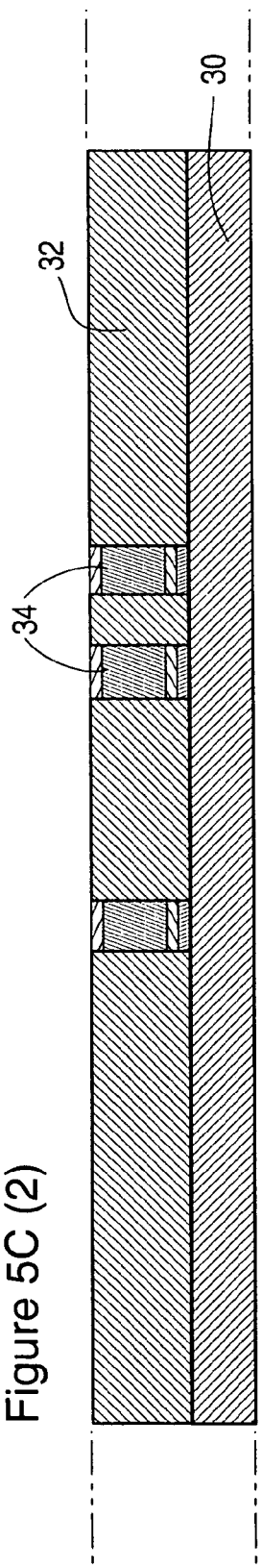
Figure 5C (2)

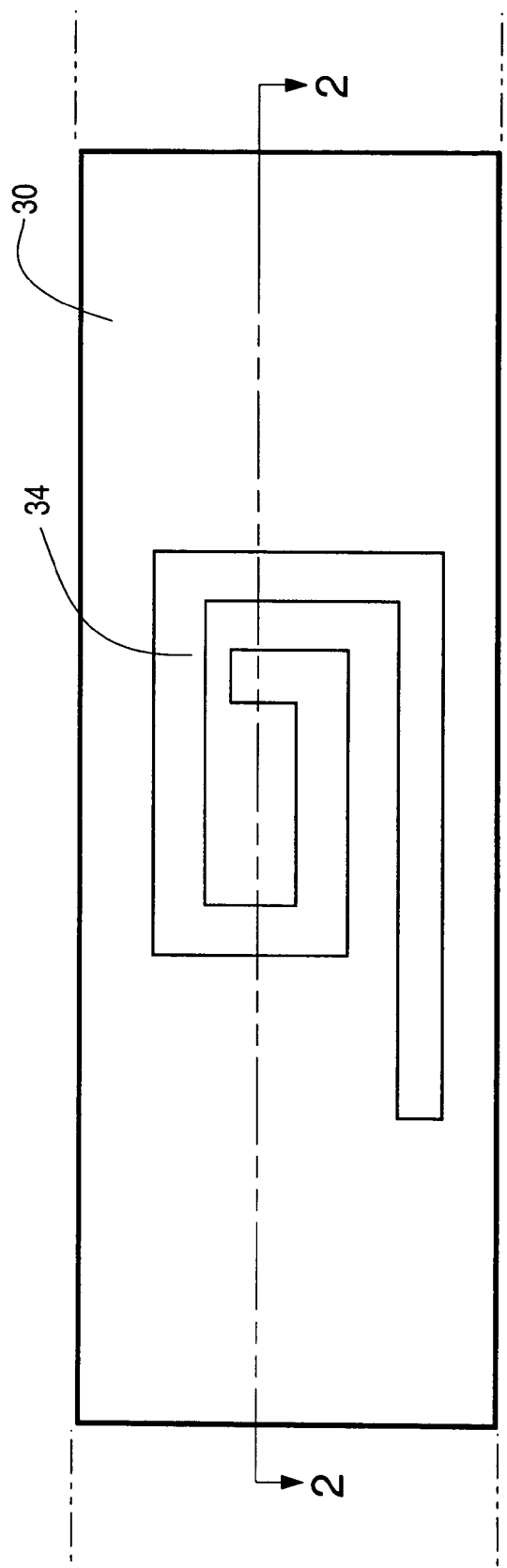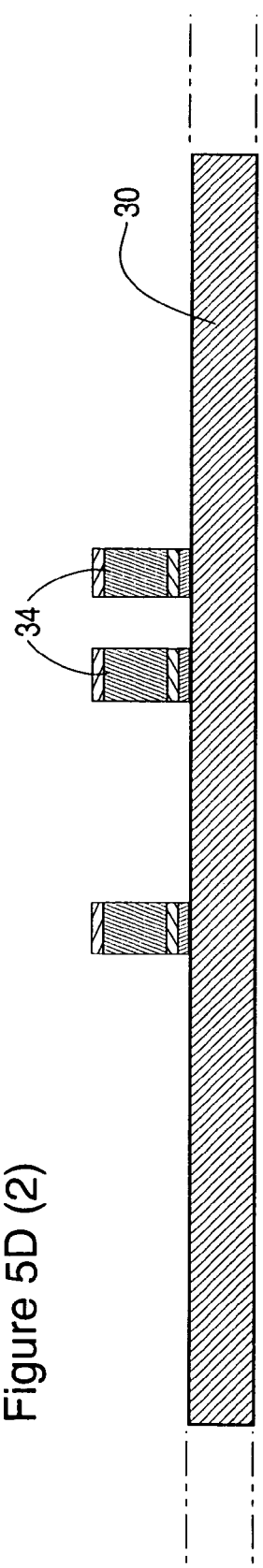

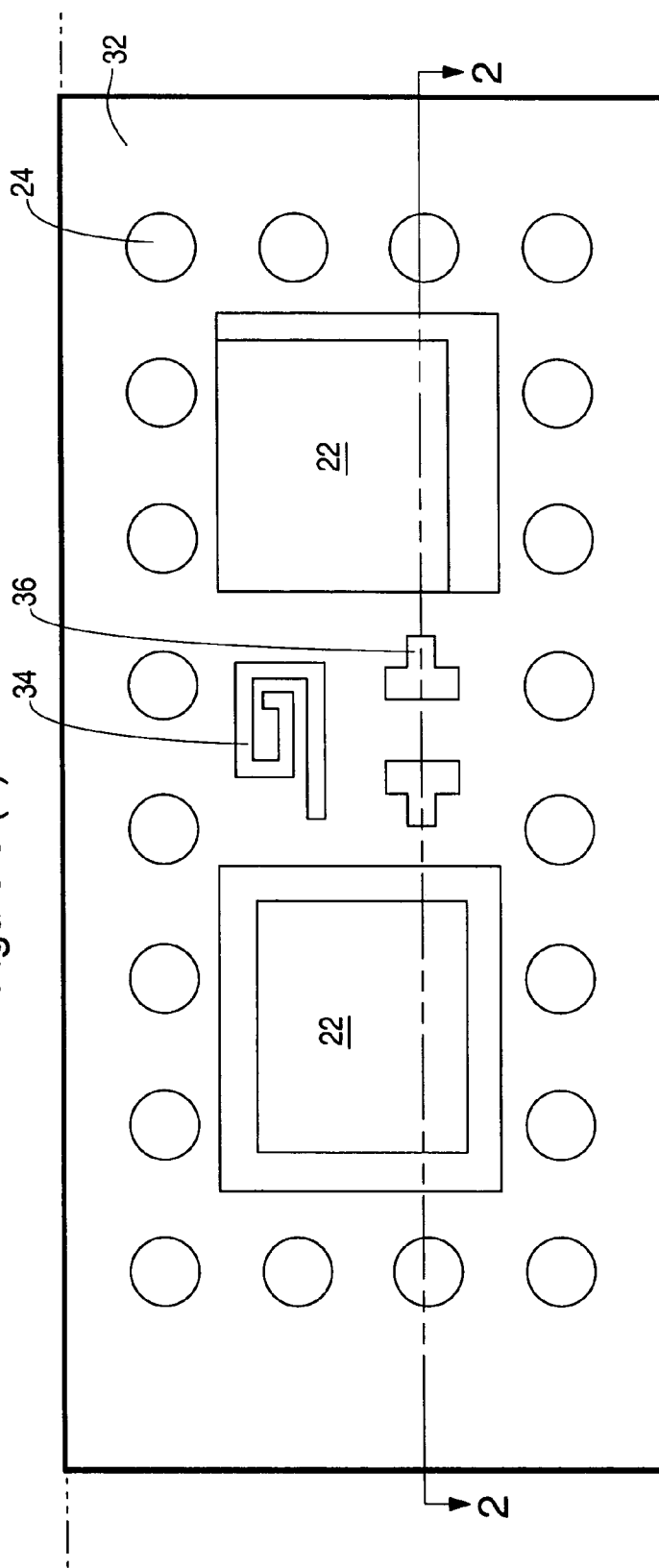
Figure 6 (1)
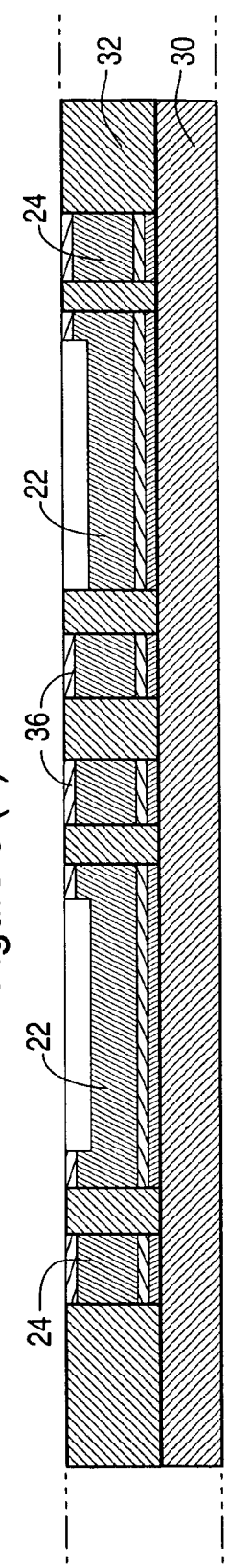
Figure 6 (2)

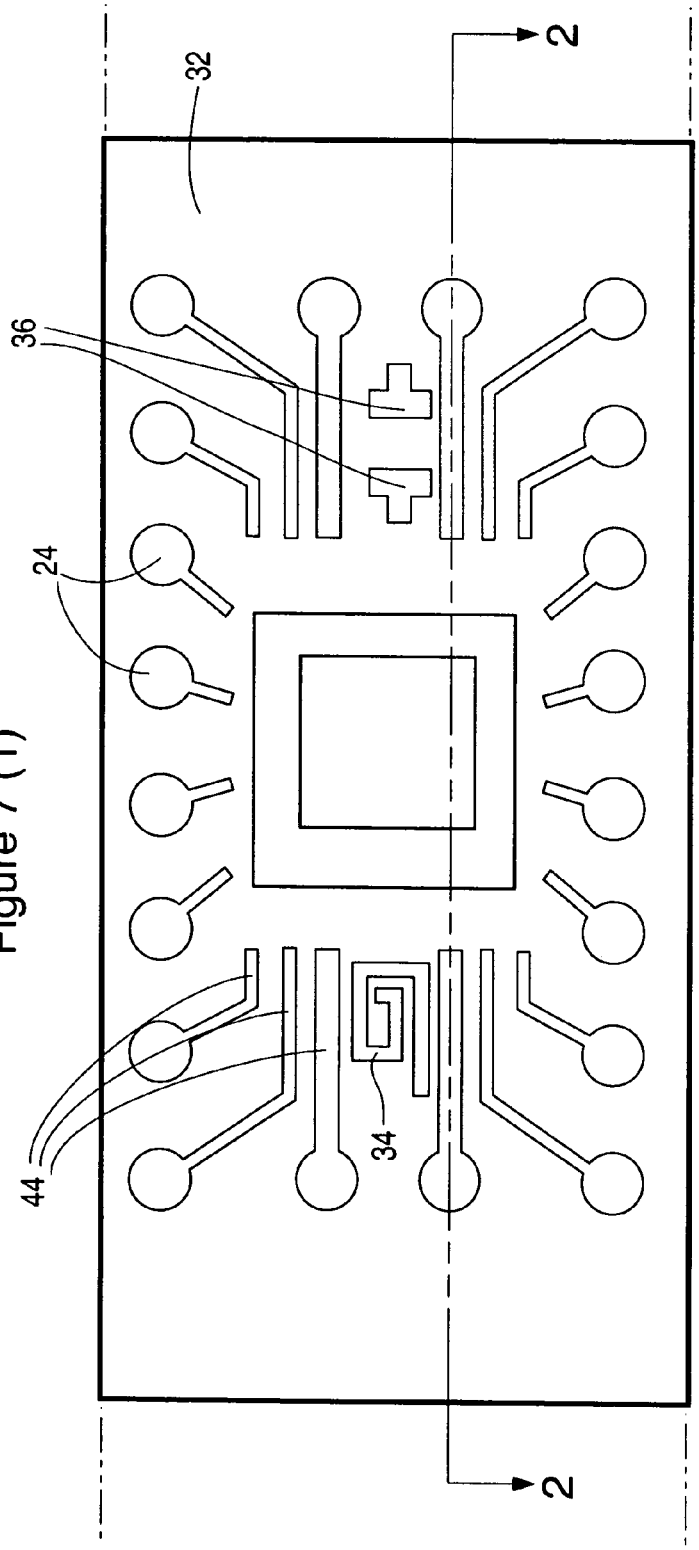
Figure 7 (1)
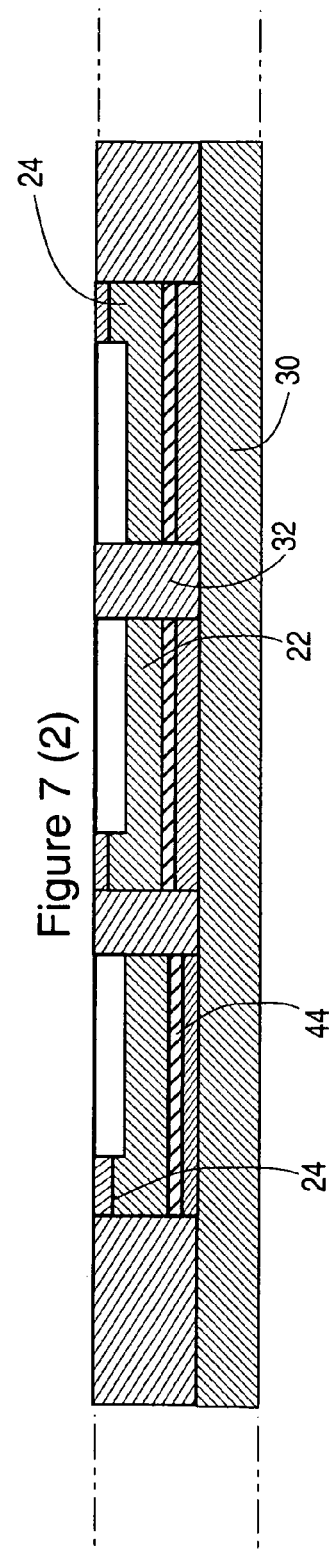
Figure 7 (2)

ELECTRONIC COMPONENTS SUCH AS THIN ARRAY PLASTIC PACKAGES AND PROCESS FOR FABRICATING SAME

CROSS REFERENCE TO RELATED APPLICATION

This is a continuation-in-part of U.S. patent application Ser. No. 09/802,678 filed Mar. 9, 2001 which is a continuation-in-part of of U.S. patent application Ser. No. 09/288,352, filed Apr. 8, 1999, now U.S. Pat. No. 6,498,099, which is a continuation-in-part of U.S. patent application Ser. No. 09/095,803, filed Jun. 10, 1998, now U.S. Pat. No. 6,229,200.

FIELD OF THE INVENTION

The present invention relates generally to electronic components and more particularly to a unique construction and process for fabricating electronic components such as thin array plastic packages, inductors and capacitors.

BACKGROUND OF THE INVENTION

According to well known prior art IC (integrated circuit) packaging methodologies, semiconductor dice are singulated and mounted using epoxy or other conventional means onto respective die attach pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting several hundred devices. Singulated IC dice are placed on the strip die attach pads using conventional die mount and epoxy techniques. After curing of the epoxy, the dice are wire bonded to the peripheral internal leads by gold (Au), copper (Cu), aluminum (Al) or doped aluminum wire bonding. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die pad is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, the contents of which are incorporated herein by reference.

According to Applicants' U.S. Pat. No. 6,498,099, the contents of which are incorporated herein by reference, an etch back process is provided for the improved manufacture of the LPCC IC package. In Applicant's co-pending U.S. application Ser. No. 09/802,678, Entitled Leadless Plastic Chip Carrier With Etch Back Pad Singulation, filed Mar. 9, 2001, the contents of which are incorporated herein by reference, the etch-back LPCC process of Applicants' U.S. Pat. No. 6,498,099 is modified to provide additional design features. The leadframe strip is selectively covered with a thin layer photo-resist mask in predetermined areas. Following the application of the mask, an etch-barrier is deposited as the first layer of the contact pads and die attach pad, followed by several layers of metals which can include for example, Ni, Cu, Ni, Au, and Ag. This method of formation of the contact pads allows plating of the pads in a columnar shape and into a "mushroom cap" or rivet-shape as it flows over the photoresist mask. The shaped contact pads are thereby locked in the mold body, providing superior board mount reliability. Similarly, the die attach pad can be formed in an interlocking shape for improved alignment with the die. The photo-resist mask is then rinsed away and the semiconductor die is mounted to the die attach pad. This is followed by gold wire bonding between the semiconductor die and the peripheral contact pads and then molding as described in Applicant's U.S. Pat. No. 6,229,200. The leadframe is then subjected to full immersion in an alkaline etchant that exposes a lower surface of an array of the contact pads, a power ring and the die attach pad, followed by singulation of the individual unit from the full leadframe array strip. This process includes the deposition or plating of a plurality of layers of metal to form a robust three-dimensional construction of contact pads and the die attach pad.

Still further improvements in high performance integrated circuit (IC) packages are driven by industry demands for increased thermal and electrical performance, decreased size and cost of manufacture. For particular applications, demand exists for multi-functional high performance packages with integrated electronic components.

It is therefore desirable to provide a process for fabricating electronic components such as thin array plastic packages including inductors and capacitors.

SUMMARY OF THE INVENTION

In one aspect of the present invention, there is provided process for fabricating an integrated circuit package includes establishing a plating mask on a first surface of a metal carrier, the plating mask defining a plurality of components including at least one die attach pad, at least one row of contact pads and at least one additional electronic component. A plurality of metallic layers are deposited on exposed portions of the first surface of the metal carrier, thereby forming the plurality of components. The plating mask is stripped from the metal carrier and leaving the plurality of metallic layers in the form of the plurality of components. At least one semiconductor die is mounted to a respective one of the at least one die attach pad such that each die attach pad has a respective semiconductor die mounted thereon and pads of each the respective semiconductor die are electrically connected to ones of the contact pads and to the additional electronic component. The first surface of the metal carrier is overmolded to encapsulate the plurality of components and the at least one semiconductor die and the metal carrier is etched away.

In another aspect of the present invention, there is provided an integrated circuit package having a plurality of components including at least one die attach pad, at least one row of contact pads and at least one additional electronic component, the plurality of components comprising a plurality of metallic layers. At least one semiconductor die is mounted to a respective one of the at least one die attach pad and electrically connected to the ones of the contact pads and to the additional electronic component. An overmold covers the at least one semiconductor die and the plurality of components.

In yet another aspect of the present invention, there is provided a process for fabricating an electronic component including establishing a suitable plating mask for the desired electronic component, on a first surface of a metal carrier. A plurality of metallic layers are deposited on exposed portions of the first surface of the metal carrier. The plating mask is stripped from the metal carrier to thereby leave the plurality of metallic layers in the form of the electronic component.

Advantageously, the thin array plastic package includes electronic components within the package. The process of an aspect of the present invention provides for the fabrication of thin array plastic packages including inductors and capacitors using a selective plating process. In another aspect of the present invention, a similar plating process is employed in manufacturing individual inductors and capacitors.

BRIEF DESCRIPTION OF THE DRAWINGS

The invention will be better understood with reference to the drawings and the following description, in which:

FIGS. 1A to 1J show process steps for fabricating an integrated circuit package, in accordance with one embodiment of the present invention;

FIGS. 4A to 4E show process steps for fabricating a capacitor, in accordance with yet another embodiment of the present invention;

FIGS. 5A to 5D show process steps for fabricating an inductor, in accordance with another embodiment of the present invention;

FIG. 6(1) shows a top view of an alternative embodiment of the integrated circuit package 20 of the present invention;

FIG. 6(2) shows a sectional side view taken along the line 2—2 of FIG. 6(1);

FIG. 7(1) shows a top view of an alternative embodiment of the integrated circuit package 20 of the present invention; and FIG. 7(2) shows a sectional side view taken along the line 2—2 of FIG. 7(1).

DETAILED DESCRIPTION OF THE PREFERRED EMBODIMENTS

Figure 11:
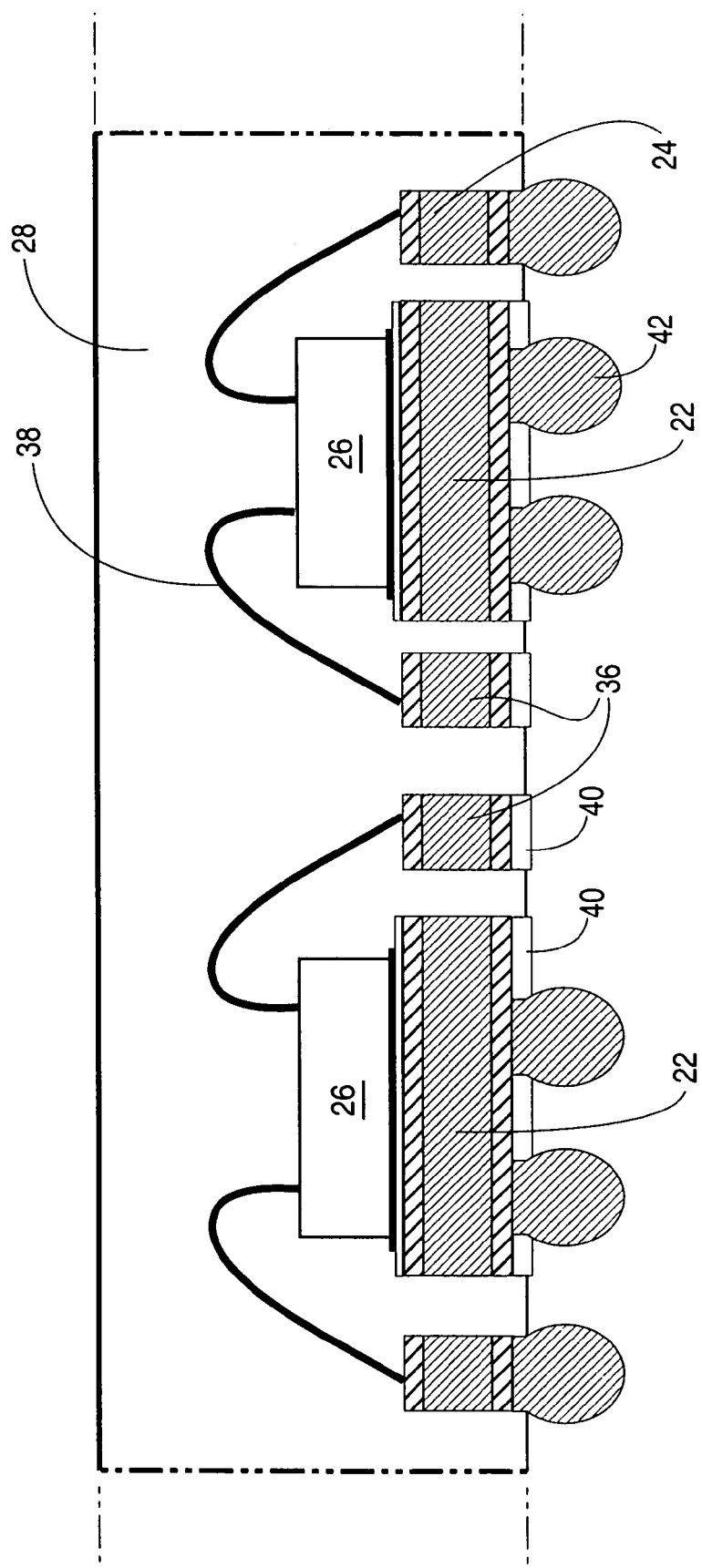

Reference is made to FIGS. 1A to 1K to describe processing steps for fabricating an integrated circuit package according to a first embodiment of the present invention, indicated generally by the numeral 20. The integrated circuit package 20 has a plurality of components including at least one die attach pad 22, at least one row of contact pads 24 and at least one additional electronic component. The plurality of components are comprised of a plurality of metallic layers. At least one semiconductor die 26 is mounted to a respective one of the at least one die attach pad 22 and electrically connected to the ones of the contact pads 24 and to the at least one additional electronic component. An overmold 28 covers the at least one semiconductor die 26 and the plurality of components.

Figure 1J:
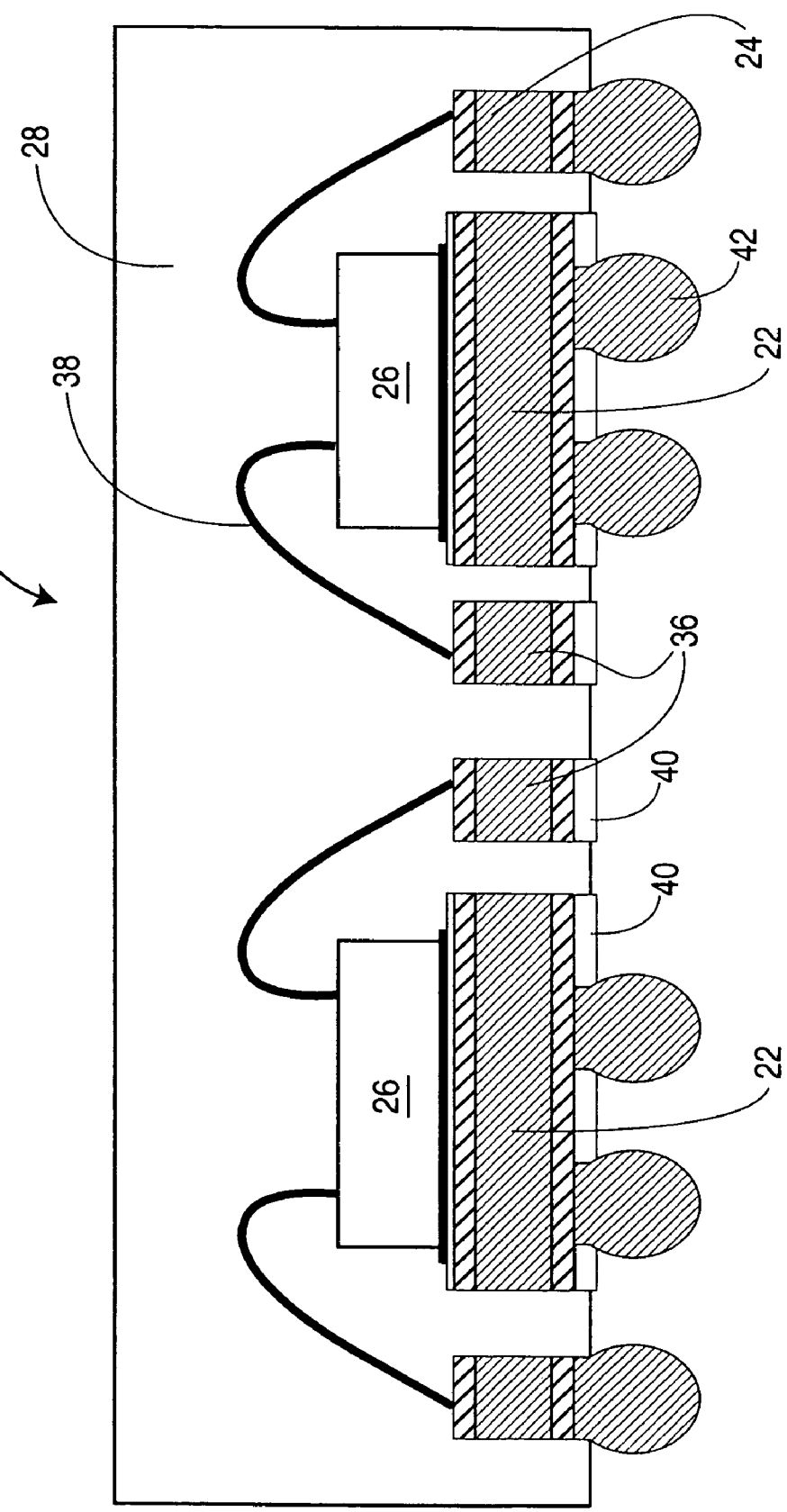

The processing steps for fabricating the integrated circuit (IC) package 20 will now be described with reference to FIGS. 1A to 1K. Reference is first made to FIG. 1A(1), which shows a top view of a metal strip 30, and to FIG. 1A(2), which shows a side view of the metal strip 30. The metal strip 30 acts as a carrier on which the IC package 20 is fabricated. It will be understood that in the present embodiment, the metal strip 30 is a copper strip that does not form part of the IC package 20 shown in FIGS. 1K(1) and 1K(2). The metal strip 30 is not limited to copper, however, as other metals are possible. The metal strip 30 is large for the fabrication of several IC packages on the single metal strip 30. Thus, the IC package of the present embodiment is gang fabricated. Only one such package is shown formed on the strip 30 in the following Figures, portions of adjacent packages are shown by stippled lines. For the purpose of simplicity, however, reference is made only to the single IC package in the following description.

A plating mask 32 is then established on one surface of the metal strip 30, as shown in FIGS. 1B(1) and 1B(2), which show a top view and a sectional side view along the line 2—2 of FIG. 1B(1), respectively, of the metal strip 30 including the plating mask 32. To establish the plating mask 32 as shown in the Figures, the metal strip 30 is coated with a layer of photo-imageable plating mask such as photo-imageable epoxy. Next, the layer of photo-imageable plating mask is imaged with a photo-tool. This is accomplished by exposure of the photo-imageable plating mask to ultraviolet light masked by the photo-tool and subsequent developing of the plating mask, as will be understood by those skilled in the art. The plating mask is thereby patterned to provide pits in which the upper surface of the metal strip is exposed. It will be appreciated that the plating mask 32 is thereby established and this plating mask 32 defines the plurality of components that are added in the following steps. In the present embodiment, the plating mask 32 defines the two die attach pads 22, the contact pads 24, an inductor 34 and a capacitor 36.

Next, several layers of metal are deposited on the upper surface of the exposed metal strip 30 to form the die attach pads 22, the contact pads 24, the inductor 34 and the capacitor 36. FIGS. 1C(1) and 1C(2) show a top view and a sectional side view taken along the line 2—2 of FIG. 1C(1), respectively, of the metal strip 30 with the deposited metal layers. Different deposition options are available. According to plating option 1, shown in FIG. 1C(3), a layer of flash Cu (for example 25 microinches) is provided over the Cu substrate for creating an etch down cavity following post etching, as will be described below. An etch barrier of gold (Au) of, for example, 20 microinches is then deposited, followed by layers of nickel (Ni) of 40 microinches, copper (Cu) of 3 to 4 mils, nickel (Ni) of 40 microinches, and gold (Au) of 20 microinches. It will be appreciated that the thicknesses of the deposited metal layers are given for exemplary purposes.

In plating option 2, an initial layer of flash Cu is deposited on the copper substrate, followed by an etch barrier of palladium (Pd), followed by layers of Ni, Cu, Ni, and Pd, as shown in FIG. 1C(4).

In plating option 3, an initial layer of flash Cu is deposited on the copper substrate, followed by an etch barrier of Ag, followed by layers of Cu and Ag, as shown in FIG. 1C(5).

In plating option 4, an initial layer of flash Cu is deposited on the copper substrate, followed by an etch barrier of Pd, followed by Ni and Pd, as shown in FIG. 1C(6).

In plating option 5, an initial layer of Cu is deposited on the copper substrate, followed by Ag, as shown in FIG. 1C(7).

After plating, the plating mask 32 is stripped away by conventional means resulting in the metal strip 30 with the die attach pads 22, contact pads 24, inductor 34 and capacitor 36 formed thereon. The metal strip 30 and the components with the plating mask 32 stripped away are shown in FIGS. 1D(1) and 1D(2), which show a top view and a sectional side view along the line 2—2 of FIG. 1D(1), respectively, of the metal strip 30 and components without the plating mask 32.

As shown in FIGS. 1E(1) and 1E(2), which show a top view and a sectional side view along the line 2—2 of FIG. 1E(1), respectively, each singulated semiconductor die 26 of a total of two semiconductor dice 26, is mounted to a respective die attach pad 22, using known techniques. In the present embodiment, the semiconductor dice are attached using silver-filled epoxy, as will be understood by those skilled in the art. In an alternative embodiment, solder paste is dispensed on each die attach pad 22 and each respective semiconductor die 26 is attached by a solder reflow technique. In this alternative embodiment, the semiconductor dice 32 are coated with a suitable surface for soldering, such as titanium (Ti), tungsten (W) or gold (Au) for mounting by solder reflow technique.

After mounting the semiconductor dice 26, wires 38 are bonded between pads of the semiconductor dice 26 and ones of the contact pads 24. Wires 38 are also bonded between the pads of the semiconductor dice 26 and the inductor 34 and between pads of the semiconductor dice 26 and the capacitor 36. Thus, the semiconductor dice 26 are mounted and are electrically connected to ones of the contact pads 24, the inductor 34 and the capacitor 36. The wires 38 are made of a suitable wire-bonding material such as Au, Cu, aluminum (Al) or doped aluminum.

Overmolding follows to encapsulate the components, the semiconductor dice 26 and the wires 38, as shown in FIGS. 1F(1) and 1F(2), which show a top view and a sectional side view taken along the line 2—2 of FIG. 1F(1), respectively. To overmold, the metal strip 30, including the components, the semiconductor dice 26 and wires 38, is placed in a mold with a flat plate bottom, molded in an overmold material 28 and cured.

Next, the metal strip 30 is etched away by subjecting the metal strip 30 to an alkaline etch using a full immersion etch. In the present embodiment, the metal strip 30 is copper and the first layer of metal deposited in forming the components was also copper (flash Cu). The alkaline etch etches away the metal strip 30 and the first layer of metal of the die attach pads 24, the contact pads 26, the inductor 34 and the capacitor 36. Thus, an etch down cavity is formed at each of the components and the die attach pads 22, the contact pads 24, the inductor 34 and the capacitor 36 are exposed. The resulting package is shown in FIGS. 1G(1) and 1G(2), which show a bottom view and a sectional side view taken along line 2—2 of FIG. 1G(1), respectively.

A solder mask 40 is then formed in selected areas of the etch down cavities, resulting in the pattern shown in FIGS. 1H(1) and 1H(2) which show a bottom view and a sectional side view taken along line 2—2 of FIG. 1H(1). The solder mask 40 is formed in selected areas by solder mask printing to cover passive components including the inductor 34 and the capacitor 36. Also, portions of the die attach pads 22 are covered, as shown, leaving the contact pads 24 and portions of the die attach pads 22 exposed.

Solder balls 42 are then fixed to the exposed contact pads 24 and the exposed portions of the die attach pads 22, as shown in FIG. 1I, which shows a sectional side view of the resulting package. To attach the solder balls 42, a flux is first added to the solder balls 42 and, after placement in position in the etch down cavities that remain after forming the solder mask 40, the solder balls 40 are reflowed using known reflow techniques. The solder balls 42 thus provide electrical connections from the semiconductor dice 26, through the wires 38 and the contact pads 24 and from the die attach pads 22. Excess flux is removed by cleaning with a suitable cleaner.

The etch down cavities provide good shear strength of solder balls 42 fixed within the etch down cavities. Also, the solder mask 40 under the inductor 34, the capacitor 36 and portions of the die attach pad 22 is better retained because of the etch down cavity formed, thereby protecting these components from the environment.

Singulation of the individual integrated circuit package 20 from the remaining packages is then performed either by saw singulation or die punching, resulting in the configuration shown in FIG. 1J.

Reference is now made to FIGS. 2A to 2J to describe the processing steps for fabricating an integrated circuit package 20 according to another embodiment of the present invention. Many of the steps for fabricating the integrated circuit package 20 of FIGS. 2A to 2J are similar to the steps for fabricating the integrated circuit package 20 of FIGS. 1A to 1J described above.

Figure 2:
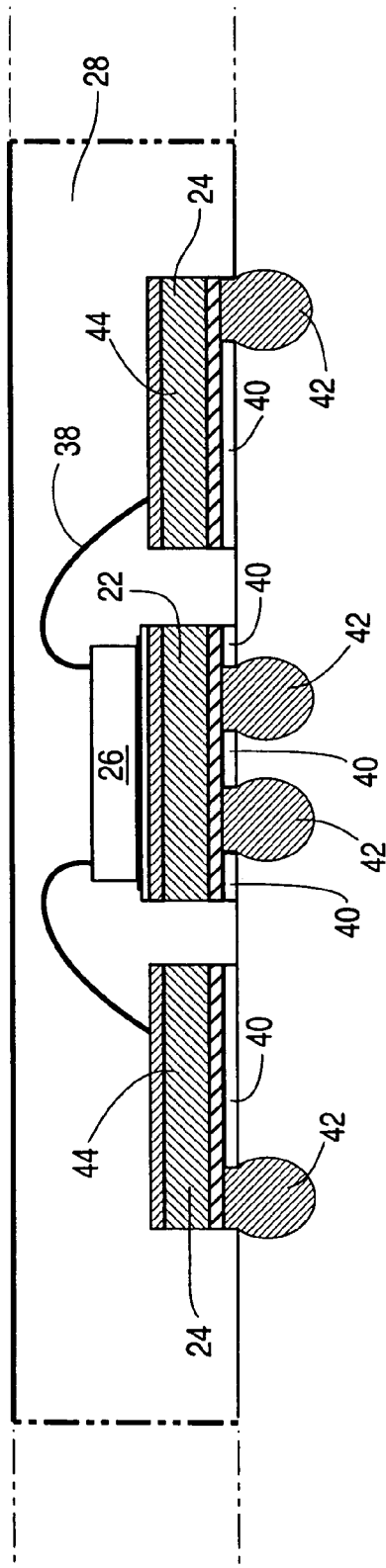
FIGS. 2A to 2J show process steps for fabricating an integrated circuit package, in accordance with another embodiment of the present invention.
Figure 2:
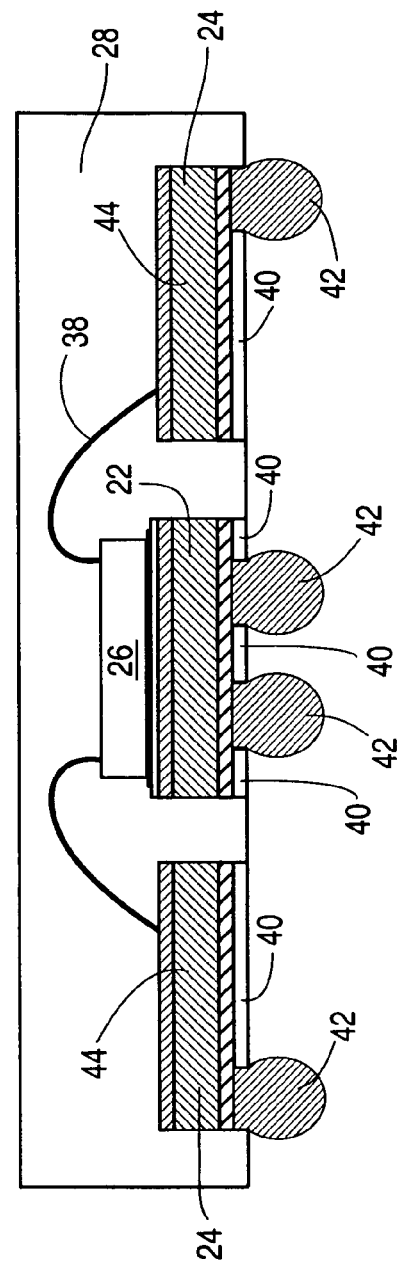

Similar to FIGS. 1A(1) and 1A(2), FIG. 2A(1), shows a top view of the metal strip 30, and FIG. 2A(2) shows a side view of the metal strip 30. The metal strip 30 of the present embodiment is similar to the metal strip 30 previously described and therefore is not further described herein.

A plating mask 32 is then established on one surface of the metal strip 30, as shown in FIGS. 2B(1) and 2B(2), which show a top view and a sectional side view along the line 2—2 of FIG. 2B(1), respectively, of the metal strip 30 including the plating mask 32. The plating mask 32 is established in the same manner that the plating mask 32 is established in the first described embodiment. In the present embodiment, however, the plating mask 32 defines a single die attach pad 22, the contact pads 24, an inductor 34, a capacitor 36 and a circuit pattern in the form of circuit traces 44 that extend from each of the contact pads 24, and end proximal the die attach pad 22.

Next, several layers of metal are deposited on the upper surface of the exposed metal strip 30 to form the die attach pad 22, the contact pads 24, the inductor 34, the capacitor 36 and the circuit traces 44. FIGS. 2C(1) and 2C(2) show a top view and a sectional side view taken along the line 2—2 of FIG. 2C(1), respectively, of the metal strip 30 with the deposited metal layers. The plating options in the present embodiment are similar to those of the first described embodiment and are shown in FIGS. 2C(3) to 2C(7).

After plating, the plating mask 32 is stripped away by conventional means resulting in the metal strip 30 with the die attach pad 22, contact pads 24, inductor 34, capacitor 36 and circuit traces 44 formed thereon. The metal strip 30 and the components with the plating mask 32 stripped away are shown in FIGS. 2D(1) and 2D(2), which show a top view and a sectional side view along the line 2—2 of FIG. 1D(1), respectively, of the metal strip 30 without the plating mask 32.

A singulated semiconductor die 26 is mounted to the die attach pad 22, using known techniques, as shown in FIGS. 2E(1) and 2E(2) which show a top view and a sectional side view along the line 2—2 of FIG. 2E(1), respectively.

After mounting the semiconductor die 26, wires 38 are bonded between pads of the semiconductor die 26 and the circuit traces 44 that extend inwardly toward the die attach pad 22. Wires 38 are also bonded between the pads of the semiconductor die 26 and the inductor 34 and between pads of the semiconductor die 26 and the capacitor 36. Thus, the semiconductor die 26 is mounted and is electrically connected to the contact pads 24 through the circuit traces 44 and the wires 38, and is electrically connected to the inductor 34 and the capacitor 36 through wires 38.

Overmolding in an overmold material 28 follows, as shown in FIGS. 2F(1) and 2F(2), which show a top view and a sectional side view taken along the line 2—2 of FIG. 2F(1), respectively.

Next, the metal strip 30 is etched away by subjecting the metal strip 30 to an alkaline etch using a full immersion etch, leaving etch down cavities at each of the die attach pad 22, the contact pads 24, the inductor 34, the capacitor 36 and the circuit traces 44. The resulting package is shown in FIGS. 2G(1) and 2G(2), which show a bottom view and a sectional side view taken along line 2—2 of FIG. 2G(1), respectively.

A solder mask 40 is then formed in selected areas of the etch down cavities, resulting in the pattern shown in FIGS. 2H(1) and 2H(2) which show a bottom view and a sectional side view taken along line 2—2 of FIG. 2H(1), respectively. The solder mask 40 is formed in selected areas by solder mask printing to cover passive components including the inductor 34 and the capacitor 36. Also, the circuit traces 44 and portions of the die attach pad 22 are covered, as shown, leaving the contact pads 24 and portions of the die attach pad 22 exposed.

Solder balls 42 are then fixed to the exposed contact pads 24 and the exposed portions of the die attach pad 22, as shown in FIG. 2I, which shows a sectional side view of the resulting package. Again, the etch down cavities provide good shear strength of solder balls 42 fixed within the etch down cavities. Also, the solder mask 40 under the inductor 34, the capacitor 36 and portions of the die attach pad 22 is better retained because of the etch down cavity formed, thereby protecting these components from the environment.

Singulation of the individual integrated circuit package 20 from the remaining packages is then performed either by saw singulation or die punching, resulting in the configuration shown in FIG. 2J.

Reference is now made to FIGS. 3A to 3J to describe the processing steps for fabricating an integrated circuit package 20 according to still another embodiment of the present invention. Many of the steps for fabricating the integrated circuit package 20 of FIGS. 3A to 3J are similar to the steps for fabricating the integrated circuit package 20 of FIGS. 2A to 2J described above.

Figure 3:
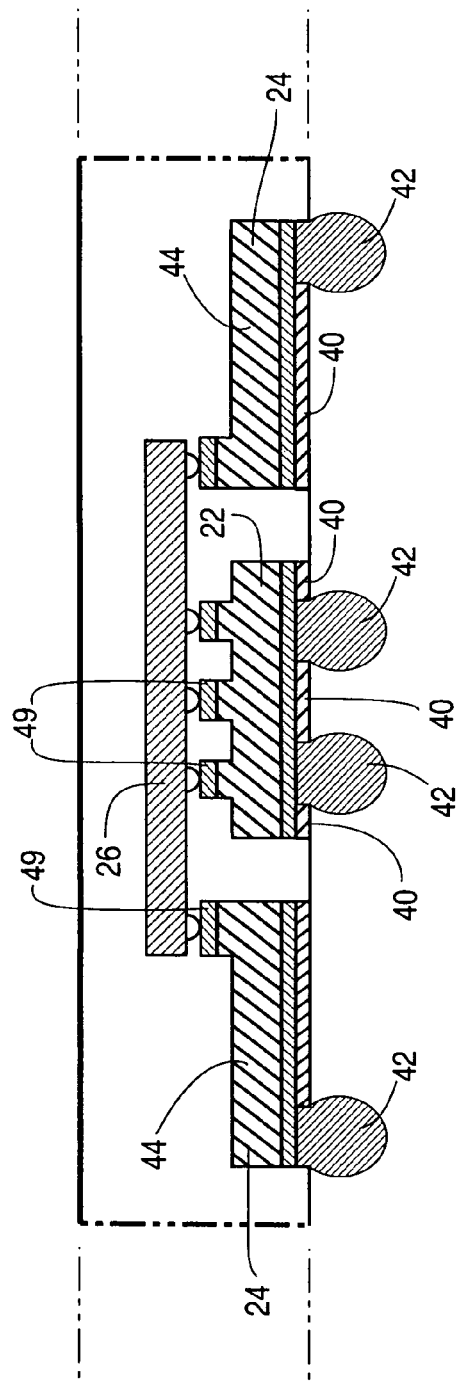
FIGS. 3A to 3J show process steps for fabricating another integrated circuit package, in accordance with still another embodiment of the present invention.
Figure 3:
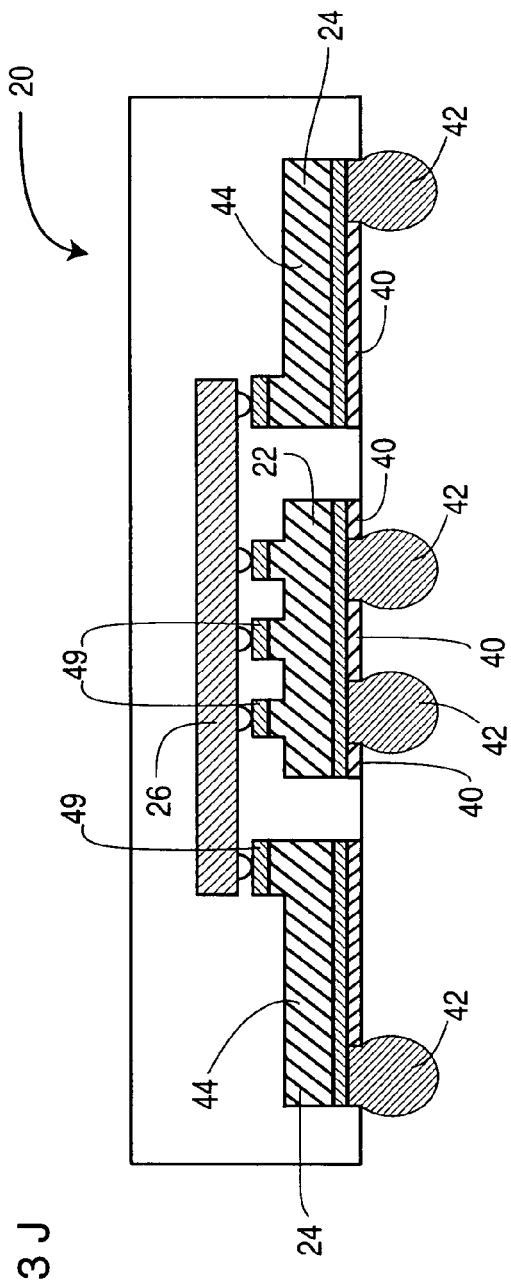

Similar to FIGS. 2A(1) and 2A(2), FIG. 3A(1), shows a top view of the metal strip 30, and FIG. 3A(2) shows a side view of the metal strip 30. The metal strip 30 of the present embodiment is similar to the metal strip 30 previously described and therefore is not further described herein.

A plating mask 32 is then established on one surface of the metal strip 30, as shown in FIGS. 3B(1) and 3B(2), which show a top view and a sectional side view along the line 2—2 of FIG. 3B(1), respectively, of the metal strip 30 including the plating mask 32. The plating mask 32 is established in the same manner that the plating mask 32 is established in the first described embodiment. In the present embodiment, however, the plating mask 32 defines a single die attach pad 22, the contact pads 24, an inductor 34, a capacitor 36 and a circuit pattern in the form of circuit traces 44 that extend from each of the contact pads 24, and end proximal the die attach pad 22. Additional circuit traces 46 also extend from the inductor 34 to an end proximal the die attach pad 22 and from the capacitor 36 to an end proximal the die attach pad 22.

Next, several layers of metal are deposited on the upper surface of the exposed metal strip 30 to form the die attach pad 22, the contact pads 24, the inductor 34, the capacitor 36, the circuit traces 44 and the circuit traces 46. FIGS. 3C(1) and 3C(2) show a top view and a sectional side view taken along the line 2—2 of FIG. 3C(1), respectively, of the metal strip 30 with the deposited metal layers. The plating options in the present embodiment are similar to those of the first described embodiment. However, in the present embodiment, an additional masking process is carried out to provide contacts for mounting the flip-chip semiconductor die for example, in the case of plating option 1, the first four layers of Cu, Au, Ni and Cu are deposited. Next, a second pilating mask 48 is added to define contacts 49 on the die attach-pad 22, the circuit traces 44 and the circuit traces 46. The remaining two metal layers of Ni and Au are then deposited to form contacts 49.

After plating, the plating mask 32 is stripped away by conventional means: resulting in the metal strip 30 with the die attach pad 22, contact pads 24, inductor 34, capacitor 36, circuit traces 44 and circuit traces 46 formed thereon. The metal strip 30 and the components with the plating mask 32 stripped away are shown in FIGS. 3D(1) and 3D(2), which show a top view and a sectional side view along the line 2—2 of FIG. 2D(1), respectively, of the metal strip 30 without the plating mask 32. Clearly the contacts 49 protrude from the remainder of the deposited metal layers of the die attach pad 22, the circuit traces 44 and the circuit-traces 46.

Reference is now made to FIGS. 3E(1) and 3E(2) which show a top view and a sectional side view along the line 2—2 of FIG. 3E(1), respectively. As shown, a singulated semiconductor die 26 is mounted to the die attach pad 22, in a flip-chip orientation, using known techniques. In this orientation, the semiconductor die 26 is attached to the contacts 49 of the die attach pad 22, the circuit traces 44 and the circuit traces 46 by direct solder attach of pads of the semiconductor die 30 to the contacts 49. Thus, the pads of the semiconductor die 30 are electrically connected to the die attach pad 22, the circuit traces 44 and the circuit traces 46.

Overmolding in an overmold material 28 follows, as shown in FIGS. 3F(1) and 3F(2), which show a top view and a sectional side view taken along the line 2—2 of FIG. 3F(1), respectively.

Next, the metal strip 30 is etched away by subjecting the metal strip 30 to an alkaline etch using a full immersion etch, leaving etch down cavities at each of the die attach pad 22, the contact pads 24, the inductor 34, the capacitor 36, the circuit traces 44 and the circuit traces 46. The resulting package is shown in FIGS. 3G(1) and 3G(2), which show a bottom view and a sectional side view taken along line 2—2 of FIG. 3G(1), respectively.

A solder mask 40 is then formed in selected areas of the etch down cavities, resulting in the pattern shown in FIGS. 3H(1) and 3H(2) which show a bottom view and a sectional side view taken along line 2—2 of FIG. 3H(1), respectively. The solder mask 40 is formed in selected areas by solder mask printing to cover passive components including the inductor 34 and the capacitor 36. Also, the circuit traces 44, the circuit traces 46, and portions of the die attach pad 22 are covered, as shown, leaving the contact pads 24 and portions of the die attach pad 22 exposed.

Solder balls 42 are then fixed to the exposed contact pads 24 and the exposed portions of the die attach pad 22, as shown in FIG. 3I, which shows a sectional side view of the resulting package.

Singulation of the individual integrated circuit package 20 from the remaining packages is then performed either by saw singulation or die punching; resulting in the configuration shown in FIG. 3J.

Reference is now made to FIGS. 4A to 4E to describe the process steps for fabricating a capacitor 36, in accordance with yet another embodiment of the present invention. Some of the steps for fabricating the capacitor 36 of FIGS. 4A to 4E are similar to the steps for fabricating the integrated circuit package 20 of FIGS. 1A to 1J described above.

Similar to FIGS. 1A(1) and 1A(2), FIG. 4A(1), shows a top view of the metal strip 30, and FIG. 4A(2) shows a side view of the metal strip 30. The metal strip 30 of the present embodiment is similar to the metal strip 30 previously described and therefore is not further described herein.

A plating mask 32 is then established on one surface of the metal strip 30, as shown in FIGS. 4B(1), 4B(2), and 4B(3), which show a top view, a sectional side view taken along the line 2—2, and a sectional side view taken along the line 3—3 of FIG. 4B(1), respectively, of the metal strip 30 including the plating mask 32. The plating mask 32 is established in the same manner that the plating mask 32 is established in the first described embodiment. In the present embodiment, however, the plating mask 32 defines the capacitor 36 only.

Next, several layers of metal are deposited on the upper surface of the exposed metal strip 30 to form the capacitor 36. FIGS. 4C(1), 4C(2), and 4C(3) show a top view, a sectional side view taken along the line 2—2 and a sectional side view taken along the line 3—3 of FIG. 4C(1), respectively, of the metal strip 30 with the deposited metal layers. The plating options in the present embodiment are similar to those of the first described embodiment and therefore are not further described herein.

After plating, the plating mask 32 is stripped away by conventional means resulting in the metal strip 30 with the capacitor 36 formed thereon. The metal strip 30 and the capacitor 36 with the plating mask 32 stripped away are shown in FIGS. 4D(1), 4D(2) and 4D(3), which show a top view, a sectional side view taken along the line 2—2 and a sectional side view taken along the line 3—3 of FIG. 4D(1), respectively of the metal strip 30 including the capacitor 36 with the plating mask 32 stripped away.

Next, a dielectric material 50 is selectively deposited between plates of the capacitor 36, as shown in FIGS. 4E(1), 4E(2) and 4E(3), which show a top view, a sectional side view taken along the line 2—2 and a sectional side view taken along the line 3—3 of FIG. 4E(1), respectively of the metal strip 30 including the capacitor 36 with the dielectric material 50 disposed between the plates of the capacitor 36.

In the present embodiment, the dielectric material 50 is an electrically non-conductive poxy that is selectively screen printed between the plates of the capacitor 36. Other dielectric materials are possible, however.

Reference is now made to FIGS. 5A to 5D to describe the process steps for fabricating an inductor 34, in accordance with still another embodiment of the present invention. Some of the steps for fabricating the inductor 34 of FIGS. 5A to 5D are similar to the steps for fabricating the capacitor 36 of FIGS. 4A to 4E described above.

Similar to FIGS. 4A(1) and 4A(2), FIG. 5A(1), shows a top view of the metal strip 30, and FIG. 5A(2) shows a side view of the metal strip 30. The metal strip 30 of the present embodiment is similar to the metal strip 30 previously described and therefore is not further described herein.

A plating mask 32 is then established on one surface of the metal strip 30, as shown in FIGS. 5B(1) and 5B(2), which show a top view and a sectional side view taken along the line 2—2 of FIG. 5B(1), respectively, of the metal strip 30 including the plating mask 32. The plating mask 32 is established in the same manner that the plating mask 32 is established in the above described embodiments. In the present embodiment, however, the plating mask 32 defines the inductor 34 only.

Next, several layers of metal are deposited on the upper surface of the exposed metal strip 30 to form the inductor 34. FIGS. 5C(1) and 5C(2) show a top view and a sectional side view taken along the line 2—2 of FIG. 5C(1), respectively, of the metal strip 30 with the deposited metal layers. The plating options in the present embodiment are similar to those of the above described embodiments and therefore are not further described herein.

After plating, the plating mask 32 is stripped away by conventional means resulting in the metal strip 30 with the inductor 34 formed thereon. The metal strip 30 and the inductor 34 with the plating mask 32 stripped away are shown in FIGS. 5D(1) and 5D(2), which show a top view and a sectional side view taken along the line 2—2 of FIG. 5D(1), respectively, of the metal strip 30 including the inductor 34 with the plating mask 32 stripped away.

Alternative embodiments of the present invention are possible. For example, rather than simply plating up metal layer after metal layer in the first described embodiment, one or more additional masking processes can be carried out to provide different plating features such as a depression in the die attach pad 22 in which the semiconductor die 26 is mounted. Also, an L-shaped plating feature on the die attach pad 22 providing a depression in which the semiconductor die-26 is mounted, is possible. These features are shown in FIG. 6(1) which shows a top view of integrated circuit package 20 after plating of the metal layers and prior to stripping the plating mask, according to an alternative embodiment of the present invention, and FIG. 6(2) which shows a sectional side view taken along the line 2—2 of FIG. 6(1). Similarly, an alternative to the second described embodiment is shown in FIG. 7(1) which shows a top view of an integrated circuit package 20 after plating of the metal layers and prior to stripping the plating mask, according to another alternative embodiment of the present invention, and FIG. 7(2) which shows a sectional side view taken along the line 2—2 of FIG. 7(1). In this embodiment, additional masking processes are carried out between deposition of the layers of metal, resulting in the semiconductor package 20 with a depression in the die attach pad 22 and depressed circuit traces 44, as shown. The fourth and fifth described embodiments can also be modified as additional masking processes can be carried out to provide different plating features on the capacitor and the inductor, respectively.

Other modifications and variations to the above-described embodiments are possible. For example, the plating options described above are provided for exemplary purposes and other alternative plating options are also possible. Also the dielectric material disposed between the plates of the capacitor in the embodiment of FIGS. 4A to 4F is not limited to an electrically non-conductive epoxy as other dielectric materials can be used. For example, a molding compound can be used as the dielectric material. Still other modifications and variations may occur to those skilled in the art. It is intended that all such modifications and variations fall within the true spirit and scope of the present invention.

What is claimed is:

1. A process for fabricating an integrated circuit package, comprising:
   establishing a plating mask on a first surface of a metal carrier, the plating mask defining a plurality of components including at least one die attach pad, at least one row of contact pads and at least one additional electronic component;
   depositing a plurality of metallic layers on exposed portions of said first surface of said metal carrier, thereby forming said plurality of components;
   stripping said plating mask from said metal carrier and leaving said plurality of metallic layers in the form of said plurality of components;
   mounting at least one semiconductor die to a respective one of said at least one die attach pad such that each die attach pad has a respective semiconductor die mounted thereon and pads of each said respective semiconductor die are electrically connected to ones of said contact pads and to said at least one additional electronic component;
   overmolding said first surface of said metal carrier to encapsulate said plurality of components and said at least one semiconductor die; and
   etching away said metal carrier.

2. The process according to claim 1, wherein etching away said metal carrier includes etching a first one of said metallic layers, thereby providing indentations at each of said plurality of components.

3. The process according to claim 2, further comprising solder mask printing to cover passive ones of said components and leaving exposed portions of said components in ones of said indentations.

4. The process according to claim 1, wherein said solder mask printing forms a pattern for solder ball attachment to said at least one die attach pad and said contact pads and said process further comprises fixing a plurality of solder balls at said exposed portions of said components.

5. The process according to claim 1, wherein said at least one additional electronic component is selected from the group consisting of at least one capacitor, at least one inductor and both a capacitor and an inductor.

6. The process according to claim 1, wherein said establishing a plating mask comprises establishing a plating mask on a first surface of a metal carrier, the plating mask defining a plurality of components including two die attach pads, at least one row of contact pads, an inductor and a capacitor.

7. The process according to claim 6, wherein said inductor and said capacitor are disposed between said die attach pads.

8. The process according to claim 1, wherein said mounting at least one semiconductor die comprises:
   mounting each said at least one semiconductor die to said respective one of said at least one die attach pad; and
   wire bonding each said at least one semiconductor die to ones of said contact pads and to said additional electronic component.

9. The process according to claim 1, wherein in said establishing a plating mask on said first surface of a metal carrier, said plurality of components further includes a circuit pattern of traces extending from said at least one row of contact pads to ends proximal said die attach pad.

10. The process according to claim 9, wherein in said establishing a plating mask on said first surface of a metal carrier, said additional electronic component comprises at least one capacitor and said circuit pattern further includes a respective trace extending in from each said at least one capacitor, to an end proximal said die attach pad.

11. The process according to claim 10, wherein said mounting at least one semiconductor die comprises:
   mounting each said at least one semiconductor die to said respective one of said at least one die attach pad; and
   wire bonding each said semiconductor die to ones of the traces.

12. The process according to claim 10, wherein said mounting at least one semiconductor die comprises:
   mounting each said at least one semiconductor die in a flip chip orientation to said respective one of said at least one die attach pad such that pads of said semiconductor die are electrically connected to ones of said traces.

13. The process according to claim 1, further comprising singulating to isolate said integrated circuit package from other packages.

14. The process according to claim 1, wherein depositing a plurality of metallic layers on exposed portions of said first surface of said metal carrier, includes further masking between depositing of said metallic layers to thereby selectively plate.

15. The process according to claim 1, wherein said establishing a plating mask comprises:
   depositing a photo-imageable mask on the first surface of the metal carrier;
   imaging said mask to provide imaged portions that define the desired electronic component; and
   developing said mask to remove the imaged portions of the mask.

* * * * *